(12) United States Patent
Nakaoka

(10) Patent No.: US 6,504,776 B1
(45) Date of Patent: Jan. 7, 2003

(54) SEMICONDUCTOR MEMORY DEVICE HAVING SENSE AMPLIFIER

(75) Inventor: Yoshito Nakaoka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/175,905

(22) Filed: Jun. 21, 2002

(30) Foreign Application Priority Data

Dec. 27, 2001 (JP) ........................................ 2001-396937

(51) Int. Cl.[7] .................................................. G11C 7/00
(52) U.S. Cl. .................... 365/203; 365/189.11; 365/205
(58) Field of Search .............................. 365/203, 205, 365/189.06, 189.11

(56) References Cited

U.S. PATENT DOCUMENTS 5,418,750 A * 5/1995 Shiratake et al. ........... 365/206
6,049,492 A * 4/2000 Vogelsang et al. .......... 365/196
6,097,652 A * 8/2000 Roh ............................ 365/205
RE37,176 E * 5/2001 Kajigaya et al. ............ 365/203

FOREIGN PATENT DOCUMENTS

| JP | 3-194789 | 8/1991 |
| JP | 5-101660 | 4/1993 |
| JP | 2000-149546 | 5/2000 |

* cited by examiner

Primary Examiner—Son T. Dinh
(74) Attorney, Agent, or Firm—McDermott, Will & Emery

(57) ABSTRACT

A sense amplifier is connected to a pair of folded bit lines via selection gates. At the time of reading data in a memory cell connected to the bit line, the pair of folded bit lines enter a floating state. At this time, the selection gate is turned off to disconnect the bit line from a sense node. After that, a potential is supplied to the bit line from an equalizer. Consequently, a semiconductor memory device of the invention can suppress deterioration in charge holding capability of a memory cell and prevent erroneous operation.

7 Claims, 23 Drawing Sheets

(A)

US 6,504,776 B1

SEMICONDUCTOR MEMORY DEVICE HAVING SENSE AMPLIFIER

BACKGROUND OF THE INVENTION

1. Field of the Invention

The present invention relates to a semiconductor memory device and, more particularly, to a semiconductor memory device of a folded bit-line architecture.

2. Description of the Background Art

FIG. 15 is a schematic block diagram showing the configuration of a memory cell array and its peripheral circuits of a conventional semiconductor memory device of a folded bit-line architecture.

A memory cell array 30 includes a plurality of blocks BK0 to BKn. Each block includes a plurality of pairs of folded bit lines BL and /BL, a plurality of word lines WL, and a plurality of memory cells MC. Each of a plurality of sense amplifiers 100 is connected to two pairs of bit lines BL and /BL.

Referring to FIG. 15, in the semiconductor memory device of the folded bit-line architecture, each sense amplifier 100 is connected to two pairs of bit lines BL and /BL. Consequently, the number of sense amplifiers in the semiconductor memory device can be reduced to almost the half of that of a conventional semiconductor memory device.

Reading operation of the semiconductor memory device of FIG. 15 will be described.

In FIG. 15, in the case of selecting block BK1, a plurality of pair of bit lines BL and /BL in the region of selected block BK1 are selected. When attention is paid to a region 301 in FIG. 15, sense amplifier 100 in region 301 selects the pair of bit lines BLL and /BLL on the block BK1 side and disconnects a pair of bit lines BLR and /BLR on the block BK2 side. Each of the other sense amplifiers 100 selects the pair of bit lines BL and /BL on the block BK1 side and disconnects the pairs of bit lines BL and /BL on the block BK2 side and on the block BK0 side.

After selecting the plurality of pairs of bit lines BL and /BL in block BK1 by the operation, a not-shown arbitrary word line WL in block BK1 is selected by a row decoder 40 to thereby select a plurality of memory cells MC (not shown) as targets of the reading operation. The data of selected plural memory cells MC is read out to the corresponding bit line BL or /BL and held by sense amplifier 100 corresponding to the pair of bit lines BL and /BL.

By sequentially changing a column address, the data held by sense amplifier 100 is successively output to not-illustrated data input/output lines IO and IO. A method of successively outputting data of a plurality of memory cells corresponding to a selected word line as described above is called a page mode access.

FIG. 16 is a circuit diagram showing the configuration of region 301 in FIG. 15.

Referring to FIG. 16, sense amplifier 100 is of a flip flop type capable of using an amplified potential as it is for rewriting. Sense amplifier 100 includes P-channel MOS transistors QP1 to QP3 and N-channel MOS transistors QN1 to QN3.

To each of bit lines BLL and /BLL, a plurality of memory cells MC are connected. Between bit lines BLL and /BLL, an equalizer 15 is connected. Equalizer 15 includes N-channel MOS transistors QN4 to QN6. Equalizer 15 operates when an activated equalize signal BLEQL is received by gates of transistors QN4 to QN6 and precharges the potential of the pair of bit lines BLL and /BLL to VCC/2.

Sense amplifier 100 and the pair of bit lines BLL and /BLL are connected to each other via a selection gate SG1. Selection gate SG1 includes N-channel MOS transistors QN7 and QN8. Transistor QN7 is connected between bit line /BLL and a sense node SN1 in sense amplifier 100. Transistor QN8 is connected between bit line BLL and a sense node SN2 in sense amplifier 100. Transistors QN7 and QN8 receive a selection signal SEL by their gates.

To each of bit lines BLR and /BLR, a plurality of memory cells MC are connected. Between bit lines BLR and /BLR, an equalizer 16 is connected. The circuit configuration of equalizer 16 is the same as that of equalizer 15 except that an equalize signal BLEQR is input to the gate of each of transistors in equalizer 16.

Sense amplifier 100 and the pair of bit lines BLR and /BLR are connected to each other via a selection gate SG2. Selection gate SG2 includes N-channel MOS transistors QN9 and QN10. Transistor QN9 is connected between bit line /BLR and sense node SN1 in sense amplifier 100. Transistor QN10 is connected between bit line BLR and sense node SN2 in sense amplifier 100. Transistors QN9 and QN10 receive a selection signal SER by their gates.

The reading operation of the semiconductor memory device having the above-described circuit configuration will be described.

FIG. 17 is a timing chart showing the reading operation in a page mode access of the conventional semiconductor memory device.

Referring to FIG. 17, operation performed in the case where the pair of bit lines BLL and /BLL in FIG. 16 will be described. Before time t0, both equalizer activate signals BLEQL and BLEQR are at the H level, so that both of the pair of bit lines BLL and /BLL and the pair of bit lines BLR and /BLR are precharged to VCC/2.

When block BK1 in FIG. 15 is selected at time t0, out of the two pairs of bit lines connected to sense amplifier 100 in region 301, the pair of bit lines BLL and /BLL is selected. Therefore, selection signal SEL maintains the H level and selection signal SER is rendered to L level. Consequently, transistors QN9 and QN10 in selection gate SG2 are turned off. As a result, the pair of bit lines BLR and /BLR are not selected.

Subsequently, equalizer activate signal BLEQL input to equalizer 15 is rendered to L level at time t1. Consequently, both bit lines /BLL and BLL enter a floating state.

At time t2, word line WLn in FIG. 16 is selected. It is now assumed that, in FIG. 16, a memory cell MC1 connected to word line WLn and bit line /BLL stores L-level data. In this case, the potential on bit line /BLL decreases slightly from VCC/2 at time t2.

When sense amplifier activate signal SEN is rendered to H level and sense amplifier activate signal /SEN is rendered to L level at time t3, sense amplifier 100 starts operating. Specifically, sense amplifier 100 amplifies the potential on bit line /BLL to a ground potential GND and amplifies the potential on bit line BLL to an internal power supply potential VCC.

Sense amplifier 100 amplifies the potential difference between bit lines /BLL and BLL and then maintains the potentials of bit lines /BLL and BLL.

After each of the plurality of sense amplifiers 100 amplifies the potential difference between the corresponding pair of bit lines BLL and /BLL in block BK1, a column address signal output from a column decoder 45 is sequentially changed. A data signal DQi of memory cell MC corresponding to the changed column address is successively output.

As described above, in the page mode access, the sense amplifier amplifies the potential difference between the bit lines of the corresponding pair. After that, until the amplified potential difference is output as data signal DQi, one of the bit lines in the pair is held at internal power supply potential VCC and the other bit line is held at ground potential GND.

At present, a semiconductor memory device is requested to be fabricated finer. By the finer fabrication, interference occurs between an interconnection in a memory cell array of a semiconductor device and a memory cell, and a problem that the charge holding function of the memory cell deteriorates occurs. Particularly, in an SDRAM characterized by a burst output as a kind of the page mode access, a period of holding the potential difference of the bit line pair to be the difference between internal power supply potential VCC and ground potential GND is long in the reading operation. Therefore, when a leak path is included between a bit line and a memory cell due to finer fabrication, deterioration in charge holding capability of the memory cell becomes conspicuous.

FIG. 18 is a schematic diagram for explaining deterioration in charge holding capability of a memory cell in the conventional semiconductor memory device.

Referring to FIG. 18, it is assumed that the charges at storage nodes of memory cells MC10 and MC20 as targets of the reading operation in memory cell array 30 are at the L level. It is also assumed that both memory cells MC1 and MC2 hold H-level data, and both memory cells MC3 and MC4 hold L-level data.

When word line WLn is selected, the potential of a bit line /BLn+1 maintains the L level, and the potential of a bit line BLn+1 maintains the H level. On the other hand, bit line /BLn maintains the L level and bit line BLn maintains the H level.

As a result, a high voltage stress is applied across memory cell MC1 storing the H-level data and bit line /BLn maintained at the L level for a predetermined period. Consequently, if a leak path R1 exists in memory cell MC1, charges dissipate in memory cell MC1. In memory cell MC2 as well, in a manner similar to memory cell MC1, a high voltage stress is applied across memory cell MC2 and bit line /BLn for a predetermined period. Therefore, if a leak path R2 exists in memory cell MC2, charges dissipate in memory cell MC2.

Memory cell MC4 is also similar to memory cell MC1. Since a high voltage stress is applied across memory cell MC4 and bit line BLn, if a leak path R4 exists, charges of memory cell MC4 dissipate.

As a result, in the reading operation in the page mode access, due to application of a high voltage stress to the bit line pair for long time, dissipation of the charges stored in the memory cell occurs.

As the voltage of a semiconductor memory device is being lowered in recent years, there is a tendency that a read margin is narrowed.

FIG. 19A is a schematic diagram for explaining the operation of sense amplifier 100 in the case where L-level data is held in memory cell MC. FIG. 19B is a schematic diagram for explaining the operation of sense amplifier 100 in the case where H-level data is held in memory cell MC.

As shown in FIG. 19A, in the case where data in memory cell MC is at the L level, a bit line to which memory cell MC is connected (hereinbelow, called on the reading side) will be set as bit line/BLa. A bit line to which memory cell MC is not connected (hereinbelow, called a reference side) will be set as bit line BLa. Further, a voltage between the gate and source of transistor QN1 in sense amplifier 100 will be set as Vgsa.

As shown in FIG. 19B, in the case where data in memory cell MC is at the H level, a bit line on the reading side will be set as bit line/BLb. A bit line on the reference side will be set as bit line BLb. Further, a voltage between the gate and source of transistor QN2 in sense amplifier 100 will be set as Vgsb.

FIG. 20 is a timing chart showing the operation of the sense amplifier in the cases of FIGS. 19A and 19B.

Referring to FIG. 20, when data stored in memory cell MC is at the L level as shown in FIG. 19A, bit line /BLa on the reading side is amplified to ground potential GND. Therefore, gate-source potential Vgsa of transistor QN1 before a sensing operation is VCC/2. When sense amplifier 100 starts operating at time t10, at time t12, the potential on reference-side bit line BLa is amplified to internal power supply potential VCC and the potential on reading-side bit line /BLa is amplified to ground potential GND. On the other hand, when data stored in memory cell MC is at the H level as shown in FIG. 19B, the potential on reference-side bit line BLb is amplified to ground potential GND. Therefore, the gate-source potential of transistor QN2 before the sensing operation is equal to VCC/2+ΔV as the potential of read-side bit line /BLb. ΔV denotes a potential which is increased when H-level data in memory cell MC is read out to bit line /BLb on the read side. Therefore, gate-source potential Vgsb of transistor QN2 in the case where data stored in memory cell MC is at the H level is higher than gate-source potential Vgsa of transistor QN1 in the case where data in memory cell MC is at the L level. The value of a current flowing by the sensing operation of sense amplifier 100 in the case where the data of memory cell MC is at the H level becomes higher than that of a current flowing by the sensing operation of sense amplifier 100 when the data in memory cell MC is at the L level. As a result, in the case where the data in memory cell MC is at the H level, when sense amplifier 100 starts operating at time t10, read-side bit line BLb is amplified to internal power supply potential VCC and reference-side bit line /BLb is amplified to ground potential GND at time t11 earlier than time t12.

As a result, due to decrease in voltage, the read margin of L-level data becomes narrower than that of H-level data. What is more, the operation of reading L-level data is influenced by ground noise.

FIG. 21 is a schematic diagram for explaining the influence of ground noise exerted on the reading operation.

Referring to FIG. 21, when block BK1 in the memory cell array in the semiconductor memory device is selected and word line WLn is selected, it is assumed that, out of the plurality of memory cells MC1 to MC8 connected to word line WLn, only memory cell MC6 has L-level data, and other memory cells MC have H-level data.

As shown in FIG. 20, the operation of sense amplifier 100 in the case of reading H-level data is faster than the operation of the sense amplifier performed in the case of reading L-level data. In FIG. 21, since a number of sense amplifiers read H-level data, a large discharge current is generated to float ground potential GND. This is ground noise GNDN.

If sense amplifier 100 for reading data stored in memory cell MC7 has not started operation, gate-source potential Vgsa of transistor QN1 in sense amplifier 100 shown in FIG. 19A becomes lower. Further, a case that L-level data is inverted to H-level data may happen.

FIG. 22 is a timing chart showing a case where data is inverted in operation of reading data in memory cell MC6 shown in FIG. 21.

Referring to FIG. 22, the timing chart of the pair of bit lines BLa and /BLa shows the operation of sense amplifier 100 on memory cell MC6. The timing chart of the pair of bit lines BLb and /BLb shows the operation of sense amplifier 100 on memory cell MC other than memory cell MC6. When the reading operation of sense amplifier 100 on the memory cell other than memory cell MC6 starts at time t15, a large charge/discharge current is generated. As a result, ground noise GNDN occurs. In the case where sense amplifier 100 starts reading operation on memory cell MC6 after ground noise GNDN occurs, if ground noise GNDN exerts an influence equally on transistors QN1 and QN2 in sense amplifier 100, there is no problem. However, before the operation of sense amplifier 100, the potential on bit line /BLa on the reading side is lower than that on bit line BLa on the reference side. Therefore, the gate-source potential of transistor QN1 becomes higher than the gate-source potential of transistor QN2. Ground noise GNDN propagates more in reading-side bit line /BLa than reference-side bit line BLa. As a result, although the data stored in memory cell MC6 is at the L level, inversion of the data occurs due to the influence of ground noise GNDN, and there is the possibility that sense amplifier 100 amplifies the potential difference between the pair of bit lines BLa and /BLa by using the data in memory cell MC6 as H-level data.

When gate-source potential Vgs decreases by the influence of ground noise, the sensing operation remarkably deteriorates and a flip flop in the sense amplifier becomes unstable. At this time, if a bit line and a data input/output line are connected to each other, the potential of the bit line is pulled by the potential of the data input/output line. It may cause data destruction.

Although the ground noise has been described above, in addition, influences of variations in charge amount at the time of reading data from a memory cell and variations in sense amplifiers at the time of manufacture cannot be also ignored. Variations in the amount of charges to be read from a memory cell at the time of reading and manufacturing process cause variations in speed of differential amplification. The variations in speed of differential amplification become ground noise or noise between lines, and it deteriorates the operation margin of the sense amplifier.

FIG. 23 is a block diagram showing a part of the memory cell array illustrated in FIG. 15.

Referring to FIG. 23, inter-line capacitance Cb1 exists between bit lines BL and /BL. Between sense nodes SN of sense amplifier 100 as well, inter-line capacitance Csa exists. By inter-line capacitance Cb1 and Csa, noise between lines which occurs due to variations in the amplification speed in the operation of the sense amplifier propagates to bit lines BL and /BL and sense amplifiers 100. As a result, the propagated noise between lines exerts an influence on the operation margin of sense amplifier 100.

For the above reasons, to assure the operation margin of the sense amplifier, the ground noise and noise between lines exerting an influence on the sense operation have to be reduced.

A semiconductor memory device aimed at reducing the noise between bit lines in the reading operation of a sense amplifier of a trap sensing type is reported in Japanese Unexamined Patent Application No. 5-101660. However, since the trap sensing type itself is sensitive to the ground noise and noise between lines, by the trap sensing type, the sensing operation margin deteriorates.

SUMMARY OF THE INVENTION

An object of the invention is to provide a semiconductor memory device having a sense amplifier, capable of suppressing deterioration in charge holding capability of a memory cell and preventing erroneous operation.

A semiconductor memory device according to the invention includes first and second bit lines constructing a folded bit-line pair, a memory cell, an equalizer, first and second sense nodes, a sense amplifier, a first switch circuit, a second switch circuit, and a control circuit. The memory cell is connected to the second bit line. The equalizer is connected to the first and second bit lines and precharges the first and second bit lines. The sense amplifier is connected to the first and second sense nodes. The first switch circuit is connected between the first bit line and the first sense node. The second switch circuit is connected between the second bit line and the second sense node. The control circuit controls the equalizer and the first and second switch circuits. The equalizer includes a first potential supply circuit and a second potential supply circuit. The first potential supplying circuit supplies a predetermined potential to the first bit line. The second potential supplying circuit supplies the predetermined potential to the second bit line. During a period between time when the equalizer precharges the first and second bit lines and time when the sense amplifier finishes operation, the control circuit controls the first potential supplying circuit so as to make the first switch circuit off while allowing the second switch circuit remain on, and supply the predetermined potential to the first bit line.

In the semiconductor memory device according to the invention, at the time of reading operation, a bit line on a reference side is disconnected from a sense node and its potential is fixed at VCC/2. In the case of disconnecting the bit line on the reference side from the sense node after the sensing operation, the voltage stress applied across a not-selected memory cell and a bit line can be lessened. Therefore, deterioration in charge holding capability of a memory cell can be prevented.

In the case of disconnecting the bit line on the reference side from the sense node after the sensing operation, in addition to the reduction in voltage address, the bit line on the reference side functions as a shield line for preventing propagation of noise occurring between bit lines. As a result, erroneous operation of a sense amplifier can be prevented. Further, since the charge/discharge current decreases, ground noise can be reduced. As a result, erroneous operation of a sense amplifier can be prevented.

Consequently, a semiconductor memory device having a sense amplifier, which can suppress deterioration in charge holding capability of a memory cell and prevent erroneous operation can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
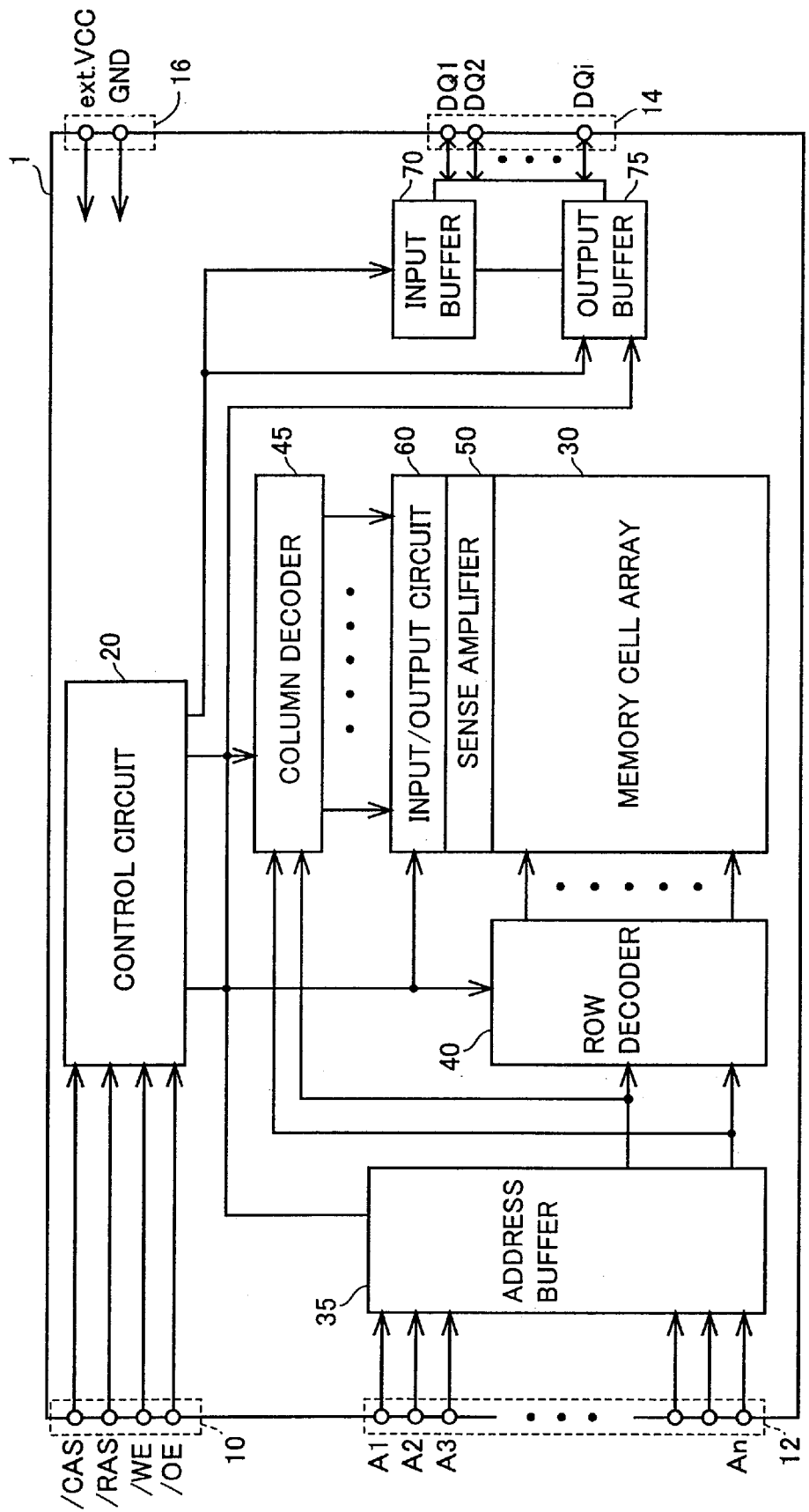
FIG. 1 is a schematic block diagram showing a general configuration of a semiconductor memory device in an embodiment of the invention.

Embodiments of the invention will be described in detail hereinbelow with reference to the drawings. The same or corresponding components in the drawings are designated by the same reference numerals and their description will not be repeated.

First Embodiment

FIG. 1 is a schematic block diagram showing a general configuration of a semiconductor memory device in an embodiment of the invention.

Referring to FIG. 1, a semiconductor integrated circuit device 1 includes a control signal input terminal 10 for receiving control signals which are a column address strobe signal /CAS, a row address strobe signal /RAS, a write enable signal /WE, and an output enable signal /OE, an address input terminal 12 for receiving address signals A1 to An (n: natural number), and a data input terminal 14 for receiving/transmitting input/output data DQ1 to DQi (i: natural number).

Semiconductor integrated circuit device 1 further includes a control circuit 20, memory cell array 30, an address buffer 35, a row decoder 40, a column decoder 45, a sense amplifier circuit 50, an input/output circuit 60, an input buffer 70, and an output buffer 75.

Control circuit 20 controls the general operation of semiconductor integrated circuit device 1 in response to a control signal input to control signal input terminal 10.

Memory cell array 30 has a plurality of memory cells arranged in a matrix. A word line is disposed for each row of memory cells, and a bit line is disposed for each column of memory cells. Each memory cell is disposed at an intersection of the word line and bit line. Bit lines construct a folded bit line pair.

Address buffer 35 selectively supplies an address signal input from the outside to row decoder 40 and column decoder 45. Row decoder 40 drives at least one of a plurality of word lines in response to a row address signal supplied from address buffer 35. Column decoder 45 drives at least one of a plurality of folded bit line pairs in response to a column address signal supplied from address buffer 35. Sense amplifier circuit 50 includes a plurality of sense amplifiers. One sense amplifier is disposed for two folded bit line pairs and amplifies a potential difference between the folded bit lines.

Input/output circuit 60 supplies the potential of the folded bit line pair selected by column decoder 45 to output buffer 75. Output buffer 75 amplifies the supplied potential and outputs the resultant as output data DQ1 to DQi to the outside. When input data DQ1 to DQi is input from the outside, input buffer 70 amplifies input data DQ1 to DQi. Input/output circuit 60 receives amplified input data DQ1 to DQi and supplies input data DQ1 to DQi to the bit line pair selected by column decoder 45.

Figure 2:
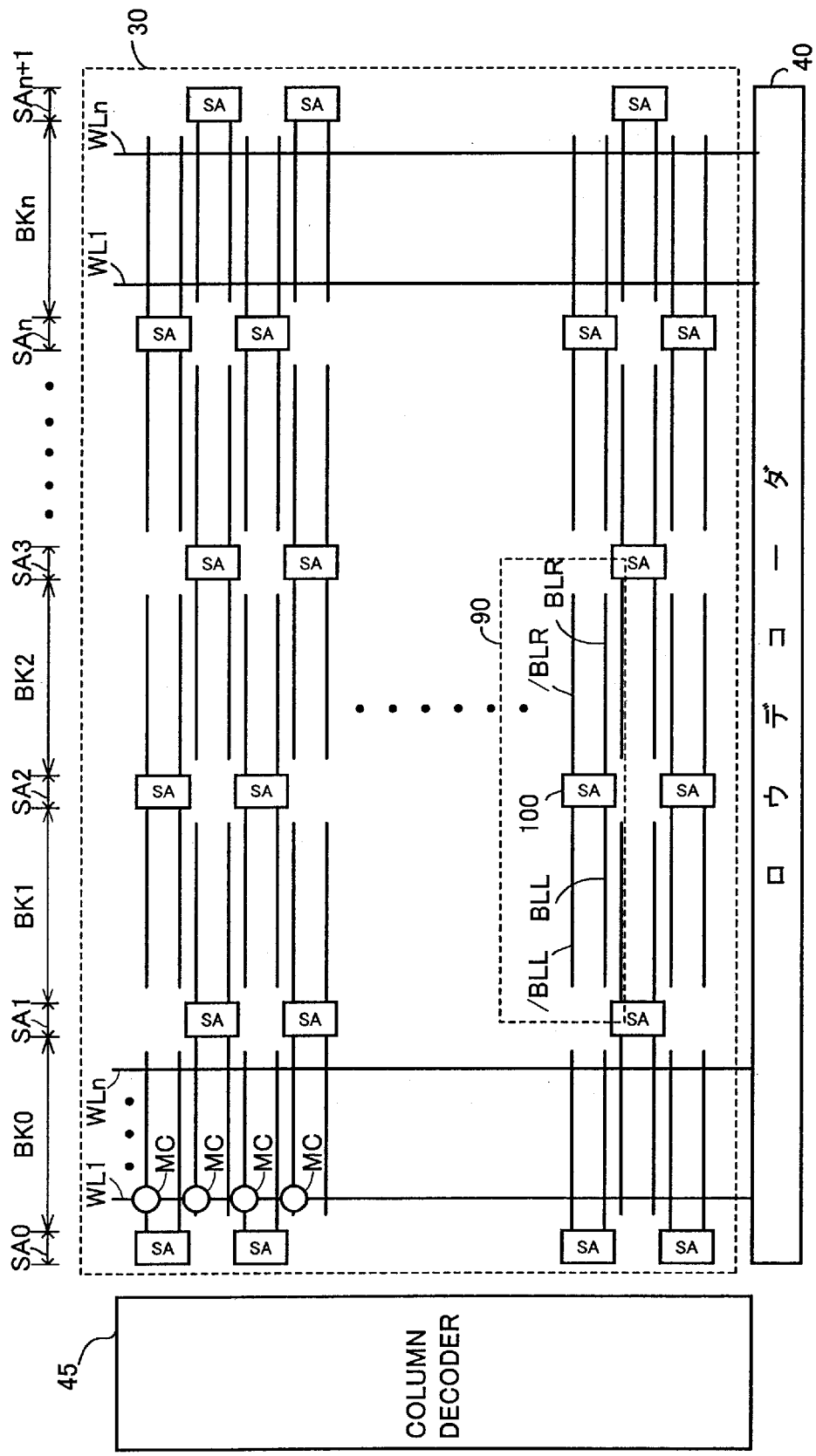
FIG. 2 is a block diagram showing the details of the configuration of a memory cell array and a sense amplifier in FIG. 1.

FIG. 2 is a block diagram showing the details of the configuration of a memory cell array and a sense amplifier in FIG. 1.

Referring to FIG. 2, memory cell array 30 includes a plurality of memory cell array blocks BK0 to BKn. Memory cell array blocks BK0 to BKn are arranged in parallel with column decoder 45. Each memory cell array block includes a plurality of pairs of folded bit lines BL and /BL, a plurality of word lines WL0 to WLn (n: natural number), and a plurality of memory cells.

Sense amplifier 50 circuit of FIG. 1 includes a plurality of sense amplifier bands SA0 to SAn+1 shown in FIG. 2. The sense amplifier bands and memory cell array blocks are alternately arranged. Each sense amplifier band includes a plurality of sense amplifiers 100.

The pairs of folded bit lines BL and /BL in each memory cell array block BKn include the pair of folded bit lines BLR and /BLR connected to sense amplifier 100 in sense amplifier band SAn and the pair of folded bit lines BLL and /BLL connected to sense amplifier 100 in sense amplifier SAn+1. The pairs of folded bit lines BLR and /BLR and the pairs of folded bit lines BLL and /BLL are alternately arranged in parallel with row decoder 40. To each sense amplifier 100, the pair of bit lines BLR and /BLR and the pair of bit lines BLL and /BLL are connected.

Word lines WL0 to WLn are arranged in parallel with column decoder 45.

Each of memory cells MC is arranged at an intersection of one of bit lines BL and /BL of each pair and each word line.

Figure 3:
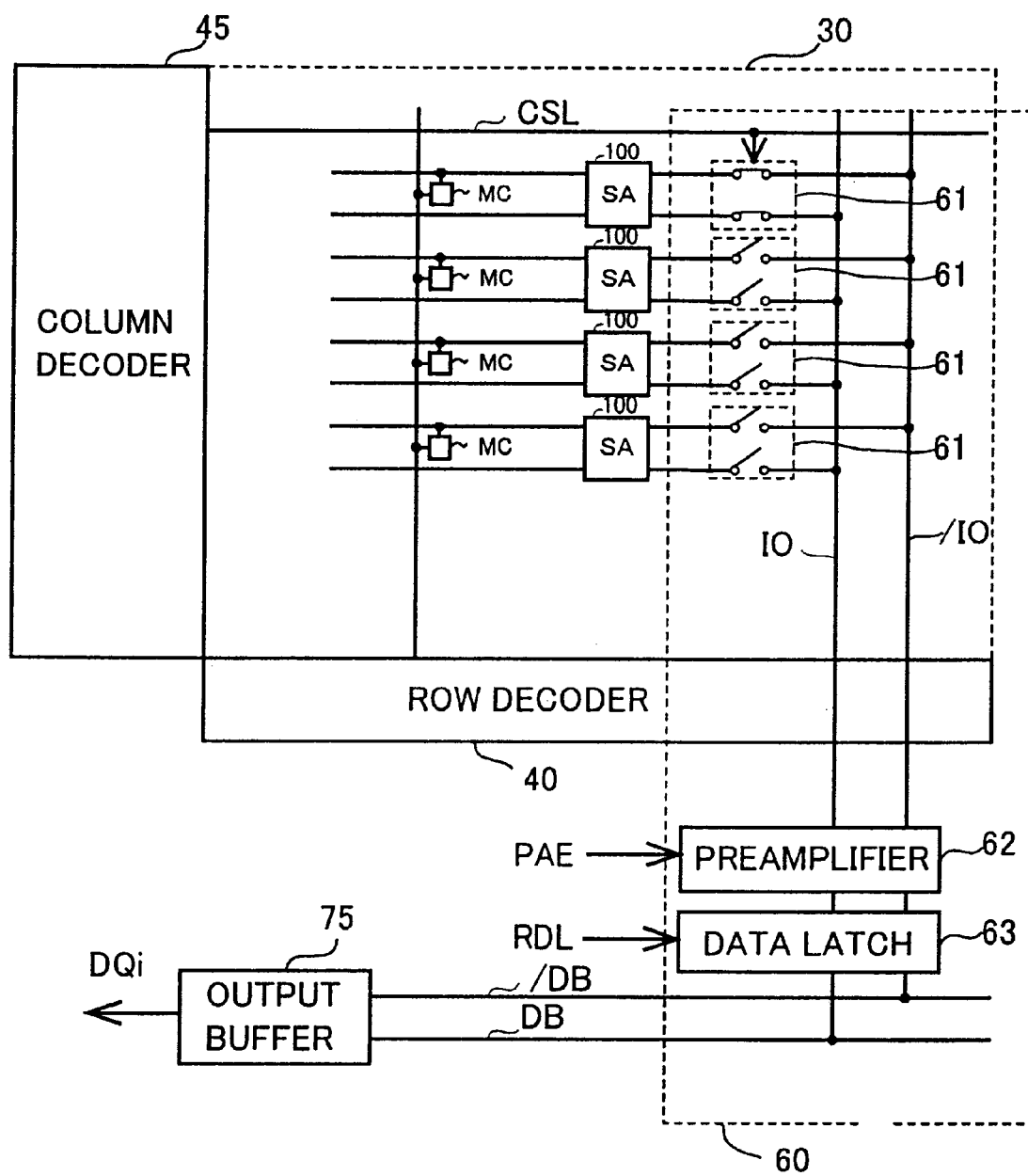
FIG. 3 is a block diagram showing the details of the configuration of a sense amplifier and an input/output circuit in FIG. 1.

FIG. 3 is a block diagram showing the details of the configuration of a sense amplifier and an input/output circuit in FIG. 1.

Referring to FIG. 3, input/output circuit 60 includes a plurality of column selection gates 61, a preamplifier 62, and a data latch circuit 63.

A plurality of sense amplifiers 100 in memory cell array 30 are connected to a pair of data input/output lines IO and /IO via corresponding column selection gate 61. When corresponding column selection line CSL is selected, column selection gate 61 connects sense amplifier 100 and the pair of data input/output lines IO and /IO.

Preamplifier 62 is connected to the pair of data input/output lines IO and /IO. Preamplifier 62 receives a preamplifier activate signal PAE of the H level, amplifies the potential difference between the pair of data input/output lines IO and /IO, and outputs the resultant as data signal DQi. Data latch circuit 63 takes data signal DQi output from preamplifier 62 when a data latch signal RDL is at the L level. When data latch signal RDL is at the H level, data latch circuit 63 latches data signal DQi. Preamplifier activate signal PAE and data latch signal RDL are output from control circuit 20. Output buffer 75 outputs data signal DQi corresponding to the state of the pair of data lines DB and /DB.

Figure 4:
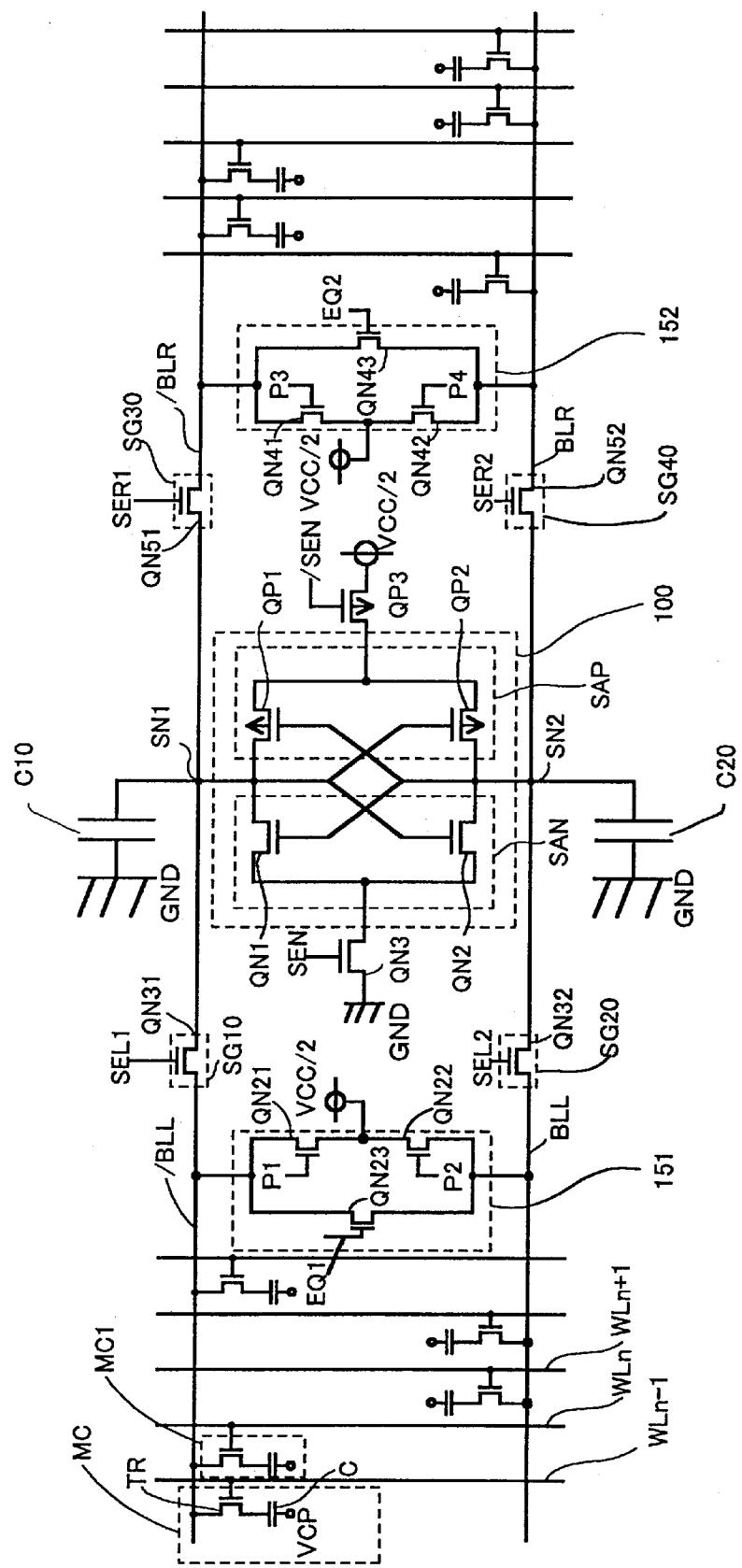
FIG. 4 is a circuit diagram showing the details of a region in FIG. 1.

FIG. 4 is a circuit diagram showing the details of a region 90 in FIG. 2.

Referring to FIG. 4, sense amplifier 100 is of a flip flop which can use an amplified potential as it is for rewriting. Sense amplifier 100 includes P-channel MOS transistors QP1 to QP3 and N-channel MOS transistors QN1 to QN3. Transistors QP1 and QP2 construct a P-type sense amplifier SAP for amplifying a bit line to internal power supply potential VCC. Transistors QN1 and QN2 construct an N-type sense amplifier SAN for amplifying a bit line to ground potential GND. Transistor QP3 connects P-type sense amplifier SAP and the node of internal power supply potential VCC. Transistor QN3 connects N-type sense amplifier SAN and the node of ground potential GND.

Plurality of memory cells MC are connected to each of the pair of bit lines BLL and /BLL. Each memory cell MC includes an access transistor TR and a capacitor C. Access transistor TR and capacitor C are connected in series between corresponding bit line BLL or /BLL and a cell potential VCP. The gate of access transistor TR is connected to corresponding word line WLn (n: natural number).

Between bit lines BLL and /BLL, an equalizer 151 is connected. Equalizer 151 includes N-channel MOS transistors QN21 to QN23. Transistor QN21 is a transistor for precharging bit line /BLL to VCC/2 and is connected between the node of the potential VCC/2 and bit line /BLL. A precharge signal P1 is input to the gate of transistor QN21. Transistor QN22 is a transistor for precharging bit line BLL to VCC/2 and is connected between a node of the potential VCC/2 and bit line BLL. A precharge signal P2 is input to the gate of transistor QN22. Transistor QN23 is a transistor for equalizing bit lines BLL and /BLL and is connected between bit lines BLL and /BLL. An equalize signal EQ1 is input to the gate of transistor QN23. Precharge signals P1 and P2 and equalize signal EQ1 are output from control circuit 20.

A selection gate SG10 is connected between sense node SN1 and bit line /BLL and constructed by an N-channel MOS transistor QN31. A selection signal SEL1 is input to the gate of N-channel MOS transistor QN31. A selection gate SG20 is connected between sense node SN2 and bit line BLL and constructed by an N-channel MOS transistor QN32. A selection signal SEL2 is input to the gate of N-channel MOS transistor QN32. Selection signals SEL1 and SEL2 are input from control circuit 20. Sense amplifier 100 is connected to selection gate SG10 via sense node SN1 and is connected to selection gate SG20 via sense node SN2.

In a manner similar to bit lines BLL and /BLL, a plurality of memory cells MC are connected to each of bit lines BLR and /BLR. An equalizer 152 is connected between bit lines BRL and /BRL. Equalizer 152 includes N-channel MOS transistors QN41 to QN43. Transistor QN41 is a transistor for precharging bit line /BLR to VCC/2 and connected between the node of potential VCC/2 and bit line /BLR. A precharge signal P3 is input to the gate of transistor QN41. Transistor QN42 is a transistor for precharging bit line BLR to VCC/2, and is connected between the node of potential VCC/2 and bit line BLR. A precharge signal P4 is input to the gate of transistor QN42. Transistor QN43 is a transistor for equalizing bit lines BLR and /BLR and connected between bit lines BLR and /BLR. An equalize signal EQ2 is input to the gate of transistor QN43. Precharge signals P3 and P4 and equalize signal EQ2 are output from control circuit 20.

A selection gate SG30 is connected between sense node SN1 and bit line /BLR and constructed by an N-channel MOS transistor QN51. A selection signal SER1 is input to the gate. A selection gate SG40 is connected between sense node SN2 and bit line BLR and constructed by an N-channel MOS transistor QN52. A selection signal SER2 is input to the gate of N-channel MOS transistor QN52. Selection signals SER1 and SER2 are input from control circuit 20.

A capacitor C10 is connected to sense node SN1. The other end of capacitor C10 is connected to the node of ground potential GND. On the other hand, a capacitor C20 is connected to sense node SN2. The other end of capacitor C20 is connected to the node of ground potential GND.

The reading operation of the semiconductor memory device having the above circuit configuration will be described.

Figure 5:
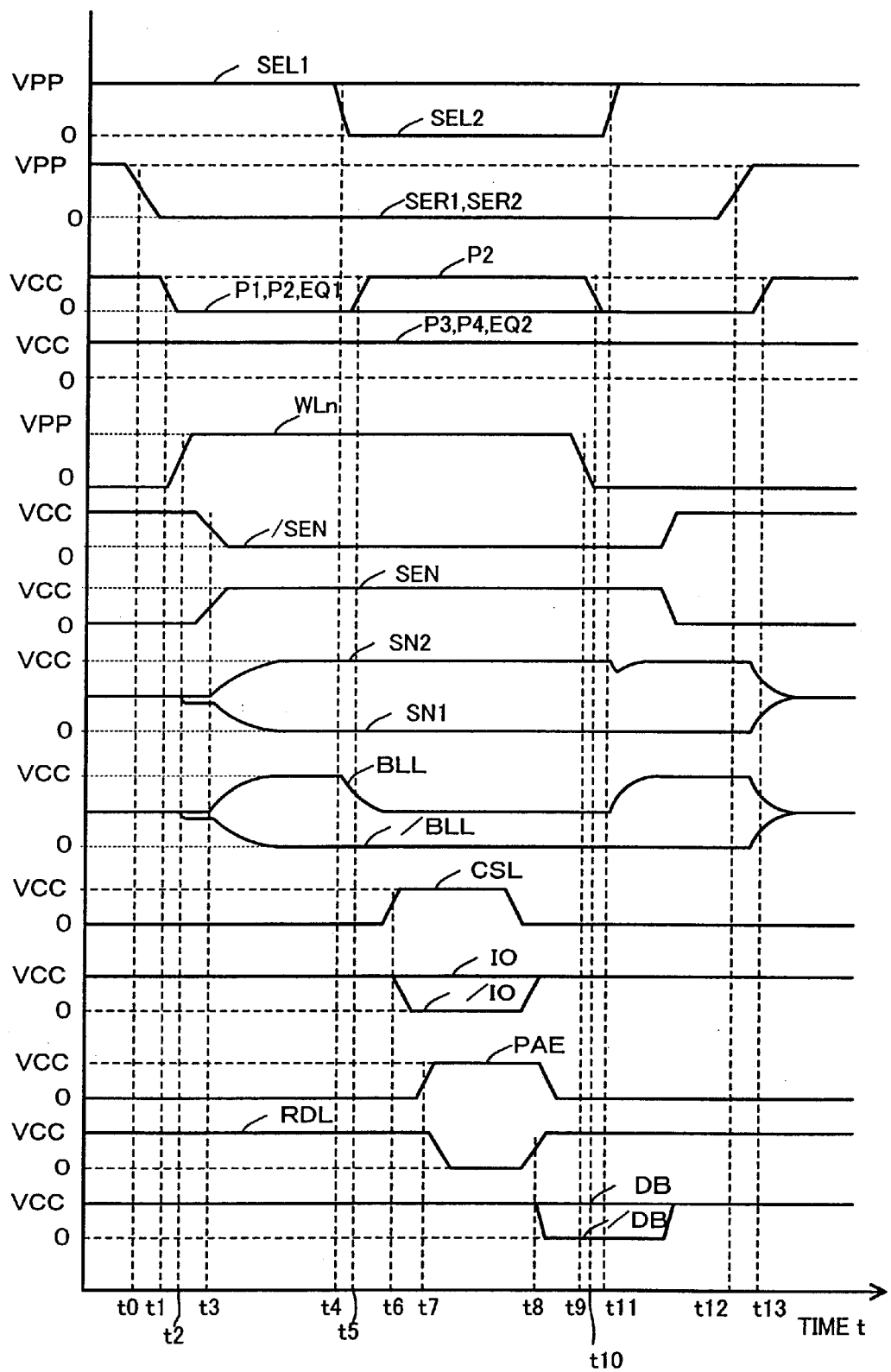
FIG. 5 is a timing chart showing the operation of the semiconductor memory device in the first embodiment of the invention.

FIG. 5 is a timing chart showing the operation of the semiconductor memory device in the first embodiment of the invention.

A case of selecting word line WLn in FIG. 4 and reading data in memory cell MC1 will be described.

Referring to FIG. 5, before time to, all of selection signals SEL1, SEL2, SER1, and SER2 to be input to selection gates SG10 to SG40 are at the H level. Therefore, all of selection gates SG10 to SG40 are ON. As a result, sense node SN1 and bit lines /BLL and /BLR are connected to each other, and sense node SN2 and bit lines BLL and BLR are connected to each other. Since all of precharge signals P1 and P2 and equalize signal EQ1 which are input to equalizer 151 are at the H level, the pair of bit lines BLL and /BLL is precharged to VCC/2. Similarly, all of precharge signals P3 and P4 and equalize signal EQ2 which are input to equalizer 152 are at the H level. Therefore, the pair of bit lines BLR and /BLR is also precharged to VCC/2.

At time t0, selection signals SER1 and SER2 are rendered to L level. Therefore, selection gates SG30 and SG40 are turned off. As a result, the pair of bit lines BLR and /BLR is disconnected from sense amplifier 100. On the other hand, the pair of bit lines BLL and /BLL maintain a state where they are connected to sense amplifier 100.

At time t1, all of precharge signals P1 and P2 and equalize signal EQ1 which are input to equalizer 151 are rendered to L level. The pair of bit lines BLL and /BLL accordingly enter a floating state. On the other hand, all of precharge signals P3 and P4 and equalize signal EQ2 which are input to equalizer 152 maintain the H level. As a result, the pair of bit lines BLR and /BLR maintain the potential VCC/2.

At time t2, word line WLn is selected. At this time, access transistor TR in memory cell MC1 is turned on, and the L-level data held by memory cell MC1 is read out to bit line /BLL. As a result, the potential of bit line /BLL decreases from VCC/2 only by ΔV.

At time t3, sense amplifier activate signals SEN and /SEN are activated. As a result, sense amplifier 100 starts sensing operation, amplifies the potential of bit line /BLL to ground potential GND and amplifies the potential of bit line BLL to internal power supply potential VCC. After amplifying the potentials on the pair of bit lines BLL and /BLL, sense amplifier 100 maintains the resultant potentials.

At time t4 after elapse of a predetermined period since sense amplifier 100 has finished the amplification of the potentials of the pair of bit lines BLL and /BLL, selection signal SEL2 input to selection gate SG20 is set to the L level. Selection gate SG20 is therefore turned off, and bit line BLL and sense node SN2 are disconnected from each other. As a result, the potential of bit line BLL disconnected from sense amplifier 100 is floated from internal power supply potential VCC. On the other hand, sense node SN2 maintains internal power supply potential VCC. Therefore, reading operation can be performed. At this time, since sense node SN2 is disconnected from bit line BLL, the capacitance decreases, and there is the possibility that sense node SN2 becomes sensitive to noises such as ground noise and noise between lines. However, capacitor C20 is connected to sense node SN2, so that sense node SN2 can hold capacitance sufficient to be resistant to noise.

At time t5, out of a plurality of signals input to equalizer 151, precharge signal P2 is set to the H level. As a result, transistor QN22 is turned on, and the potential VCC/2 is supplied to bit line BLL, and the potential of bit line BLL is precharged to VCC/2. Therefore, bit line BLL functions as a shied line to prevent propagation of inter-line noise due to capacitance between lines.

At time t6 at which bit line BLL maintains the potential VCC/2, corresponding column selection line CSL is selected. As a result, corresponding column selection gate 61 is turned on, and sense nodes SN1 and SN2 and the pair of data input/output lines IO and /IO are connected. The pair of data input/output lines IO and /IO are clamped at internal power supply potential VCC, and the L-level potential of sense node SN1 is read as an amplitude of data input/output lines IO and /IO.

At time t7, preamplifier signal PAE is activated, and preamplifier 62 amplifies the amplitude difference between data input/output lines IO and /IO. After that, data latch signal RDL is rendered to L level and data latch circuit 63 latches an output signal of preamplifier 62. When data latch signal RDL is rendered to H level at time t8, data latch circuit 63 outputs latched data signal DQi to data lines DB and /DB. Main amplifier 64 outputs L-level data signal DQi in accordance with the state of data lines DB and /DB.

When attention is paid again to the pair of bit lines BLL and /BLL, after time t9 at which word line WLn enters a not-selected state, the pair of bit lines BLL and /BLL have to equalized to VCC/2. However, the capacitance in a state where bit line /BLL and sense node SN1 are connected to each other and that in a state where bit line BLL and sense node SN2 are not connected to each other are different from each other. At time t11, selection signal SEL2 is set to the H level to turn on selection gate SG20, thereby setting bit line BLL and sense node SN2 in a connected state. Consequently, the capacitance in the state where bit line /BLL and sense node SN1 are connected to each other and that in the state where bit line BLL and sense node SN2 are connected to each other become equal to each other. Precharge signal P2 is rendered to L level at time t10.

When bit line BLL and sense node SN2 are connected to each other at time t11, the potential of bit line BLL becomes internal power supply potential VCC again.

After that, when selection signals SER1 and SER2 are rendered to H level at time t12, the pair of bit lines BLR and /BLR and sense nodes SN1 and SN2 are connected to each other. Subsequently, at time t13, precharge signals P1 and P2 and equalize signal EQ1 which are input to equalizer 150 are rendered to H level. Therefore, after time t13, the pair of bit lines BLL and /BLL are precharged to VCC/2.

By the above operation, the semiconductor memory device in the first embodiment disconnects the bit line on the reference side to which memory cells to be read are not connected in the selected pair of folded bit lines from the sense node and maintains the potential of the reference-side bit line at VCC/2. Therefore, as compared with the reading operation in the conventional semiconductor memory device, a voltage stress applied across the bit lines can be lessened. By connecting a capacitor of a sense node disconnected from the bit line, the capacitance can be assured. The semiconductor memory device according to the invention does not need installation of a new potential supplying circuit for fixing the potential of the disconnected bit line to VCC/2 and can supply the potential by using the equalizer.

In the operation in FIG. 5, sense amplifier 100 amplifies the potentials of the pair of bit lines BLL and /BLL and, after that, disconnects bit line BLL from sense node SN2. Alternately, before sense amplifier 100 starts the sensing operation, bit line BLL and sense node SN2 can be disconnected from each other.

Figure 6:
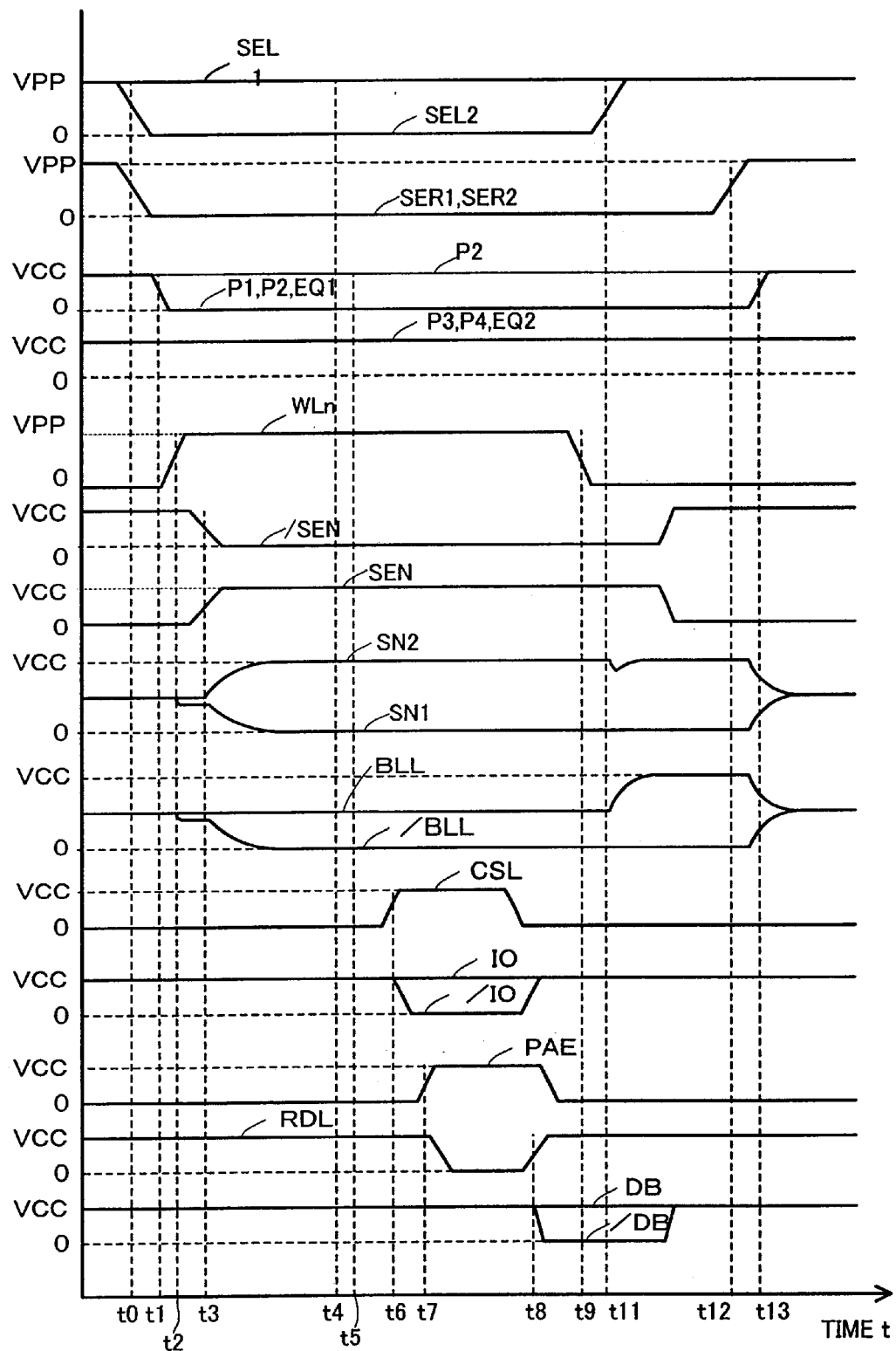
FIG. 6 is a timing chart showing another example of the operation of the semiconductor memory device in the first embodiment of the invention.

FIG. 6 is a timing chart showing another example of the operation of the semiconductor memory device in the first embodiment of the invention.

Referring to FIG. 6, when the pair of bit lines BLR and /BLR and sense nodes SN1 and SN2 are disconnected from each other at time t0, selection signal SEL2 is also set to the L level. As a result, selection gate SG20 is turned off, and bit line BLL on the reference side and sense node SN2 are disconnected from each other.

Further, precharge signal P2 input to equalizer 151 is always set to the H level. As a result, bit line BLL is disconnected from sense node SN2 before sense amplifier 100 operates, and the potential is fixed at VCC/2.

Since the other operation is the same as that of FIG. 5, its description will not be repeated.

As described above, the semiconductor memory device performing the operation of FIG. 6 disconnects bit line BLL from sense node SN2 before the sensing operation. Therefore, the semiconductor memory device performing the operation of FIG. 6 produces an effect that it can suppress generation of a charge/discharge current in addition to the effects of the semiconductor memory device performing the operation of FIG. 5. As a result, occurrence of ground noise can be suppressed. The potential of a bit line disconnected in the sensing operation is maintained at VCC/2. As a result, the disconnected bit line functions as a shield line.

Second Embodiment

Figure 7:
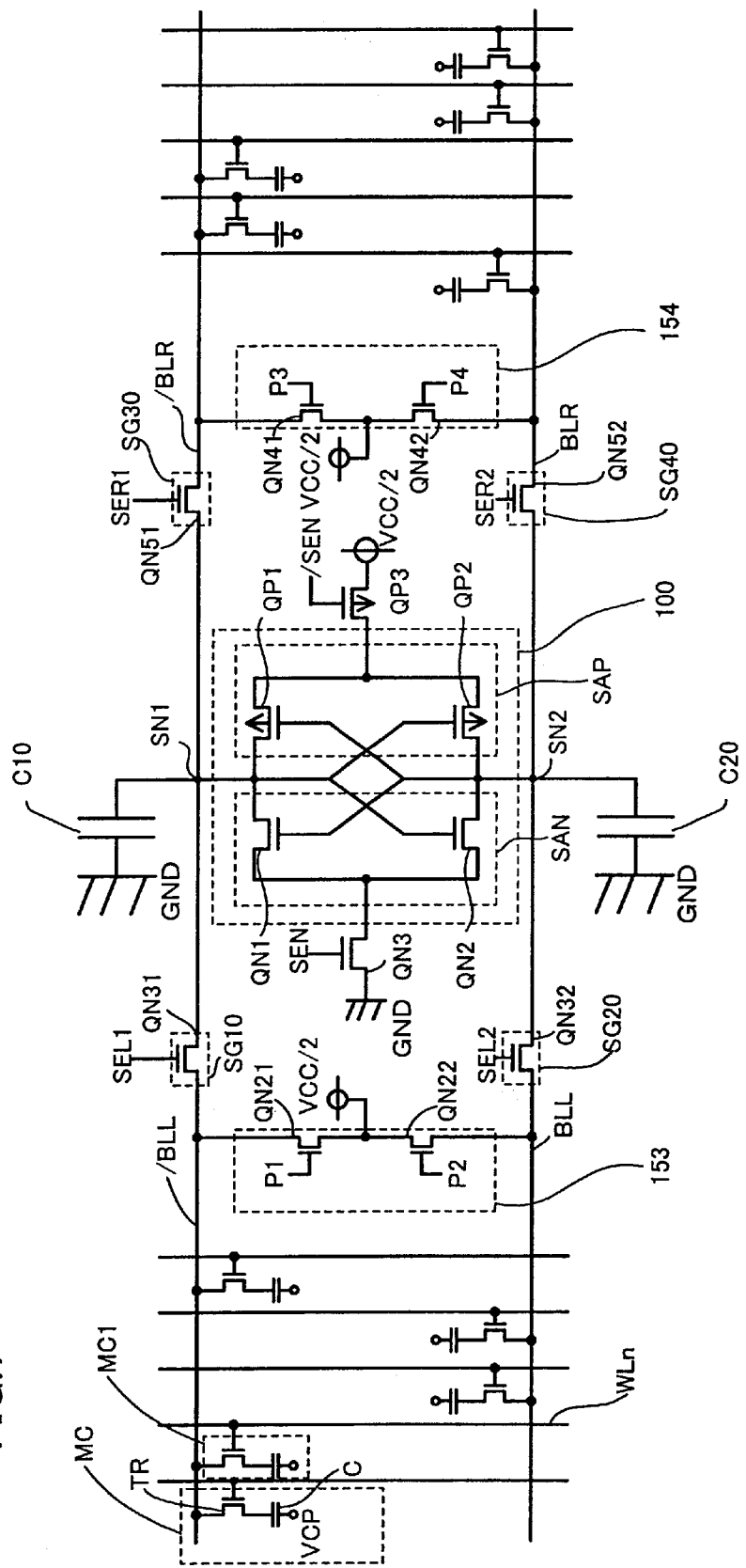
FIG. 7 is a circuit diagram showing the configuration of a sense amplifier and its peripheral circuits in a semiconductor memory device in a second embodiment of the invention.

FIG. 7 is a circuit diagram showing the configuration of a sense amplifier and its peripheral circuits in a semiconductor memory device in a second embodiment of the invention.

Referring to FIG. 7, the semiconductor memory device in the second embodiment is different from that shown in FIG. 4 with respect to that an equalizer 153 is disposed in place of equalizer 151, and an equalizer 154 is mounted in place of equalizer 152.

Equalizer 153 is obtained by eliminating a transistor QN23 for equalizing from equalizer 151. Equalizer 154 is obtained by eliminating a transistor QN43 for equalizing from equalizer 152.

Since the other circuit configuration is similar to that of the first embodiment, its description will not be repeated.

Reading operation of the semiconductor memory device having the above circuit configuration will be described.

A case where word line WLn in FIG. 7 is selected and data in memory cell MC1 is read in the reading operation of the semiconductor memory device in the second embodiment will be described.

Figure 8:
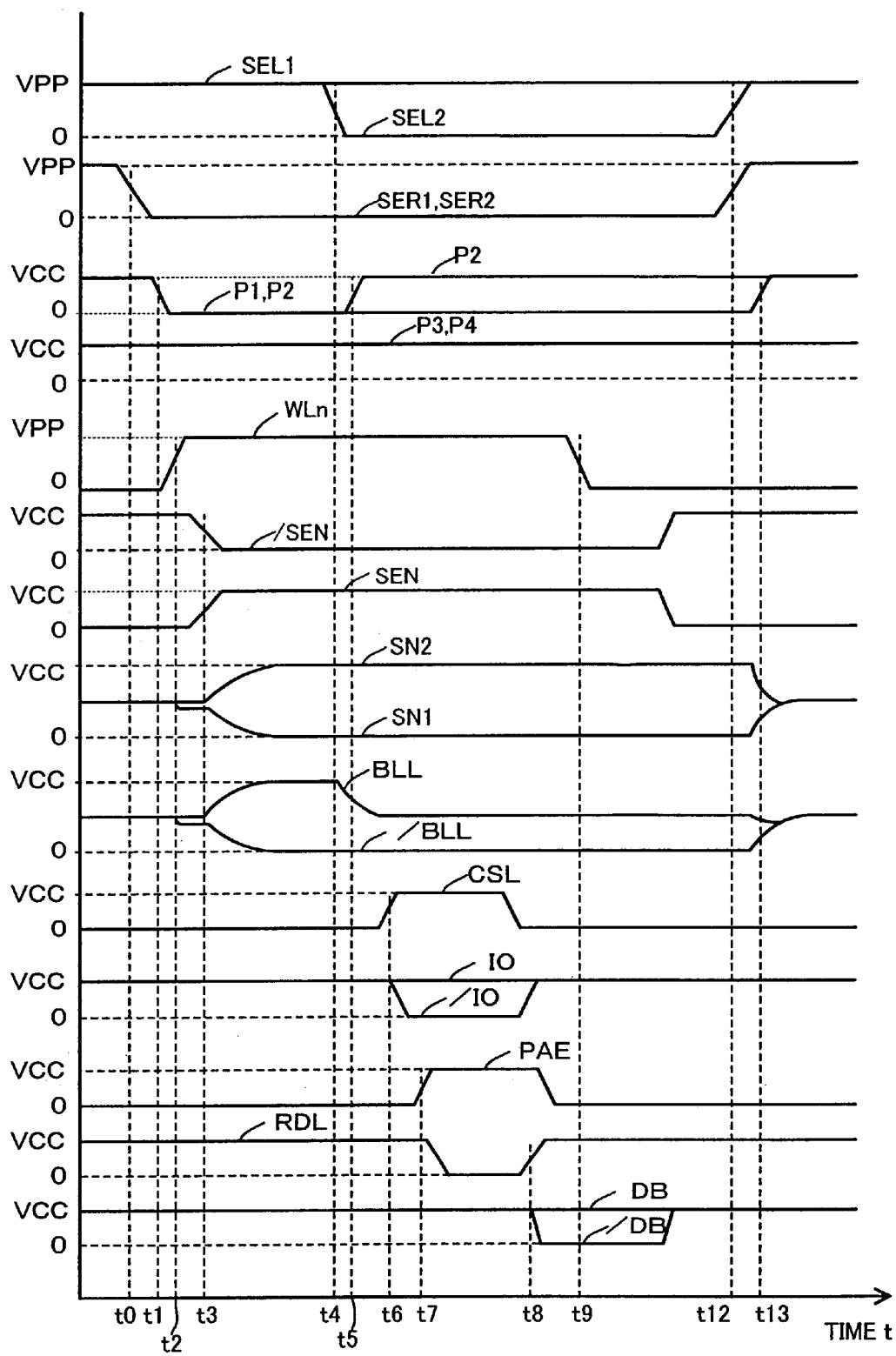
FIG. 8 is a timing chart showing the operation of the semiconductor memory device in the second embodiment of the invention.

FIG. 8 is a timing chart showing the operation of the semiconductor memory device in the second embodiment of the invention.

Since the operations performed at time t0 to t5 are the same as those in FIG. 5, their description will not be repeated.

At time t5, precharge signal P2 is set to the H level. After that, precharge signal P2 maintains the H level. On the other hand, selection signal SEL2 which is rendered to L level at time t4 is not rendered to H level at time t11 in FIG. 5 but is rendered to H level at time t12.

That is, the semiconductor memory device of the second embodiment does not perform an operation of connecting bit line BLL to sense node SN2 again after word line WLn enters the not-selected state and maintaining the potential of bit line BLL at VCC.

The semiconductor memory device in the second embodiment disconnects the reference-side bit line to which memory cells to be read are not connected in the selected folded bit line pair from the sense node and maintains the potential of the bit line at VCC/2. Consequently, the voltage stress applied across bit lines can be lessened more as compared with the reading operation in the conventional semiconductor memory device. By connecting the bit line and the capacitor of the disconnected sense node, the capacitance can be assured.

In FIG. 8, selection signal SEL2 is set to the L level after the sensing operation but, in a manner similar to the operation of FIG. 6 in the first embodiment, selection signal SEL2 can be set to the L level before the sensing operation.

Figure 9:
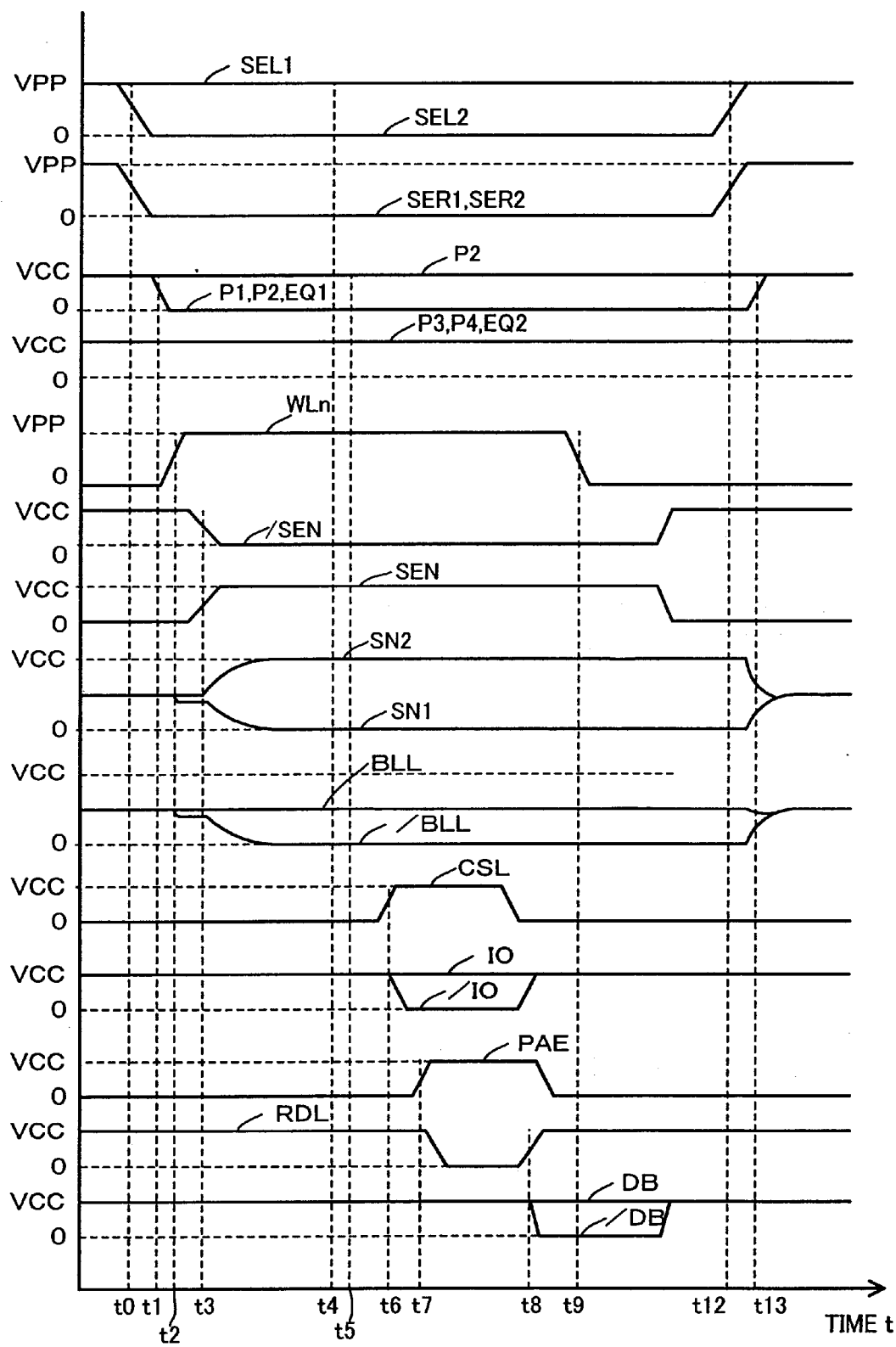
FIG. 9 is a timing chart showing another example of the operation of the semiconductor memory device in the second embodiment of the invention.

FIG. 9 is a timing chart showing another example of the operation of the semiconductor memory device in the second embodiment of the invention.

Referring to FIG. 9, when the pair of bit lines BLR and /BLR and sense nodes SN1 and SN2 are disconnected from each other at time t0, selection signal SEL2 is also set to the L level. As a result, selection gate SG20 is turned off, and bit line BLL on the reference side and sense node SN2 are disconnected from each other.

Further, precharge signal P2 input to equalizer 151 is always set to the H level. As a result, before sense amplifier 100 operates, bit line BLL is disconnected from sense node SN2 and the potential of bit line BLL is fixed at VCC/2.

Since the other operation is the same as that in FIG. 8, its description will not be repeated.

From the above, the semiconductor memory device performing the operation of FIG. 9 produces an effect that it can suppress generation of charge/discharge currents in addition of the effects of the semiconductor memory device performing the operation of FIG. 8. As a result, occurrence of ground noise can be suppressed. The potential of the bit line disconnected in the sensing operation is maintained at VCC/2. As a result, the disconnected bit line functions as a shield line.

Third Embodiment

Figure 10:
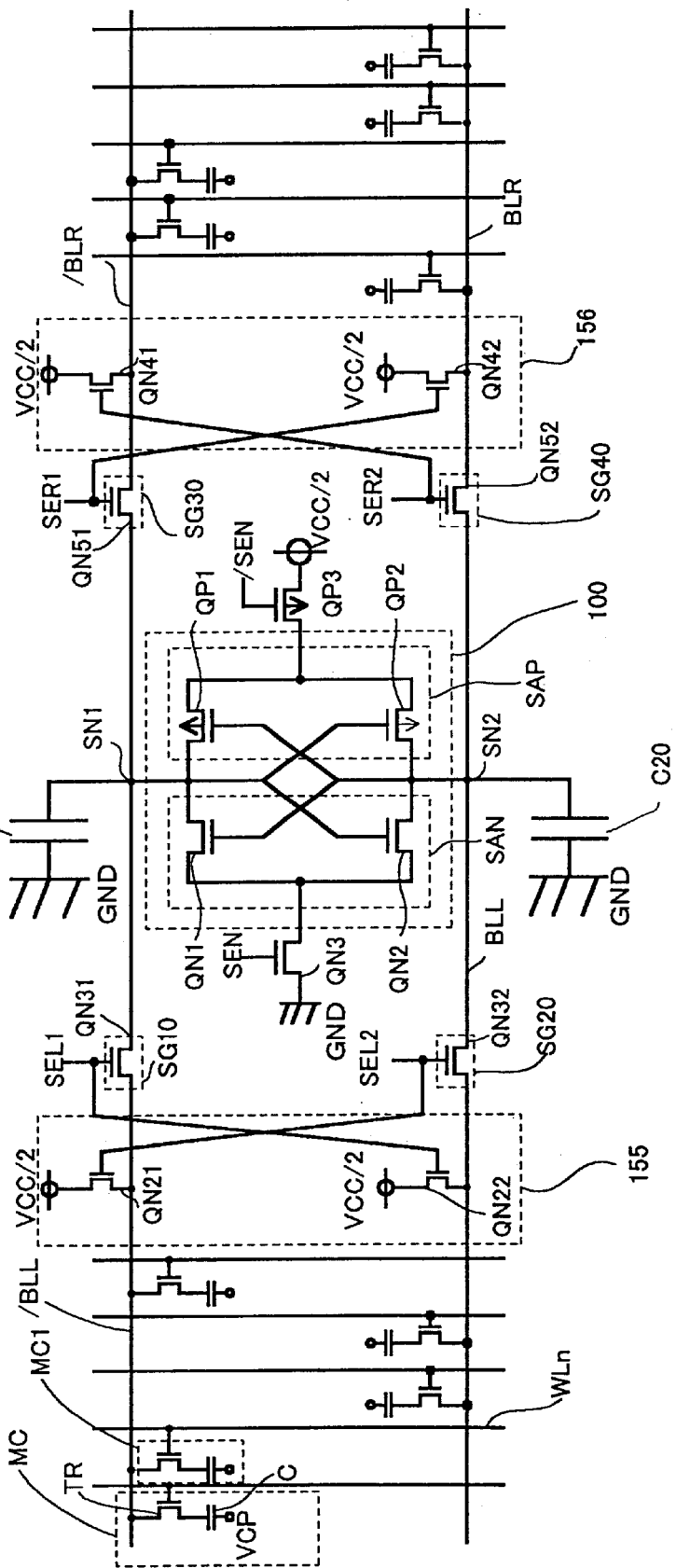
FIG. 10 is a circuit diagram showing the configuration of a sense amplifier and its peripheral circuit in a semiconductor memory device in a third embodiment of the invention.

FIG. 10 is a circuit diagram showing the configuration of a sense amplifier and its peripheral circuits in a semiconductor memory device in a third embodiment of the invention.

Referring to FIG. 10, the semiconductor memory device in the third embodiment is different from that shown in FIG. 7 with respect to that an equalizer 155 is disposed in place of equalizer 153, and an equalizer 156 is mounted in place of equalizer 154.

Equalizer 155 is different from equalizer 153 with respect to the point that as a signal input to the gate of transistor QN21, selection signal SEL2 is used in place of precharge signal P1. As a signal input to the gate of transistor QN22, selection signal SEL1 is used in place of precharge signal P2.

Similarly, equalizer 156 is different from equalizer 154 with respect to the point that as a signal input to the gate of transistor QN41, selection signal SER2 is used in place of precharge signal P3. As a signal input to the gate of transistor QN42, selection signal SER1 is used in place of precharge signal P4.

Thus, the number of interconnections can be suppressed in the semiconductor memory device of the third embodiment.

Since the other circuit configuration is similar to that of FIG. 7, its description will not be repeated.

A case where word line WLn in FIG. 10 is selected and data in memory cell MC1 is read in the reading operation of the semiconductor memory device in the third embodiment will be described.

Figure 11:
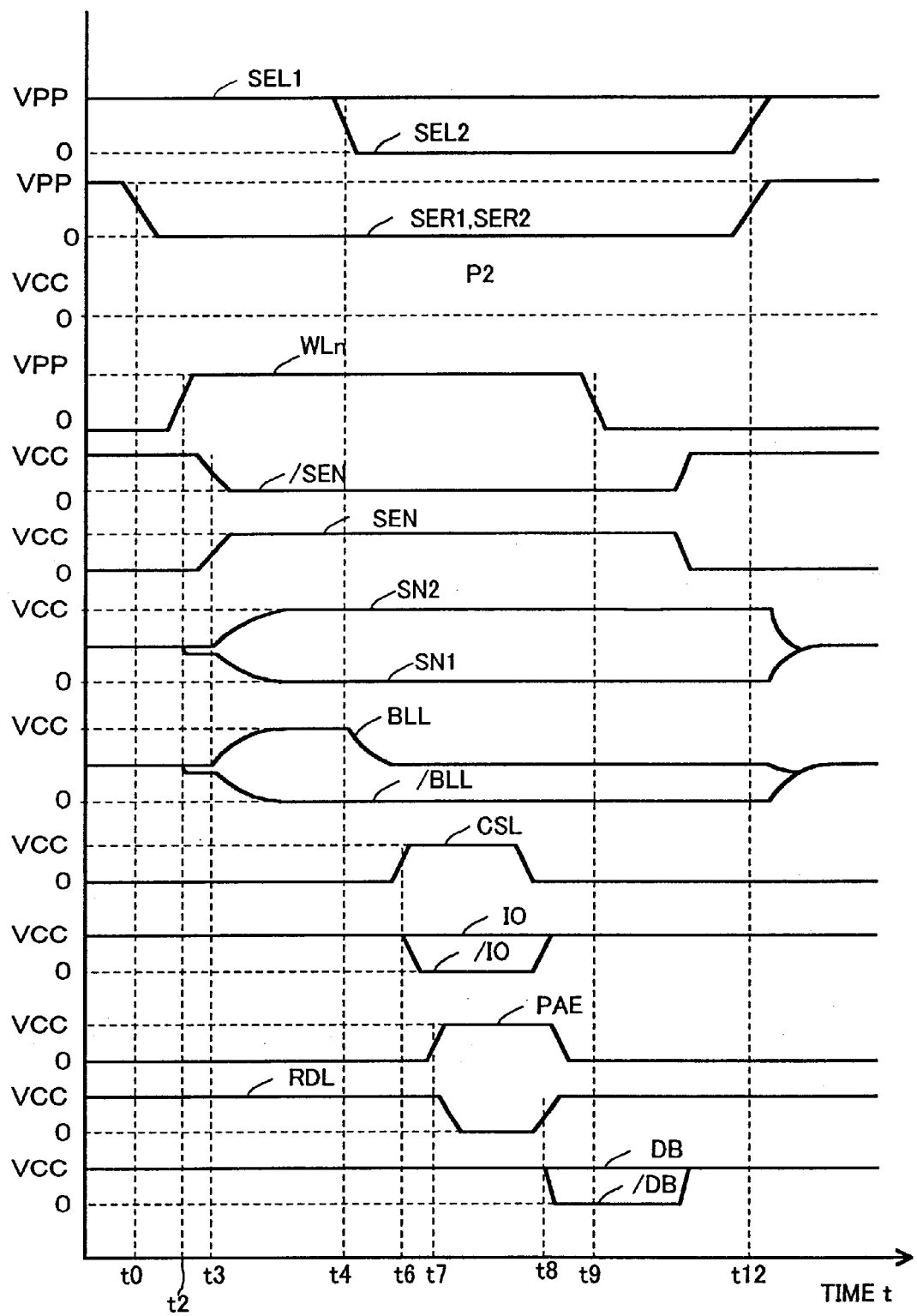
FIG. 11 is a timing chart showing reading operation of the semiconductor memory device in the third embodiment.

FIG. 11 is a timing chart showing the reading operation of the semiconductor memory device in the third embodiment of the invention.

Operations performed at time t0 to t4 are the same as the reading operation of the semiconductor memory device in the second embodiment in FIG. 8 except that bit lines /BLR and BLR enter a floating state with the potential of VCC/2 when selection signals SER1 and SER2 are rendered to L level.

When selection signal SEL2 is rendered to L level at time t4, selection gate SC20 is turned off and transistor QN21 is turned off. Consequently, bit line /BLL enters a floating state, bit line BLL is disconnected from sense node SN2, and the potential of bit line BLL is maintained at VCC/2.

When selection signal SEL2 is turned on at time t12, bit line BLL is connected to sense node SN2. Further, transistor QN21 is turned on, and the potential of bit line/BLL is precharged to VCC/2.

Since the other operation is similar to that of FIG. 8, its description will not be repeated.

Although selection signal SEL2 is set to the L level after the sensing operation in FIG. 11, in a manner similar to the operation of FIG. 9 in the second embodiment, selection signal SEL2 can be also set to the L level before the sensing operation.

Figure 12:
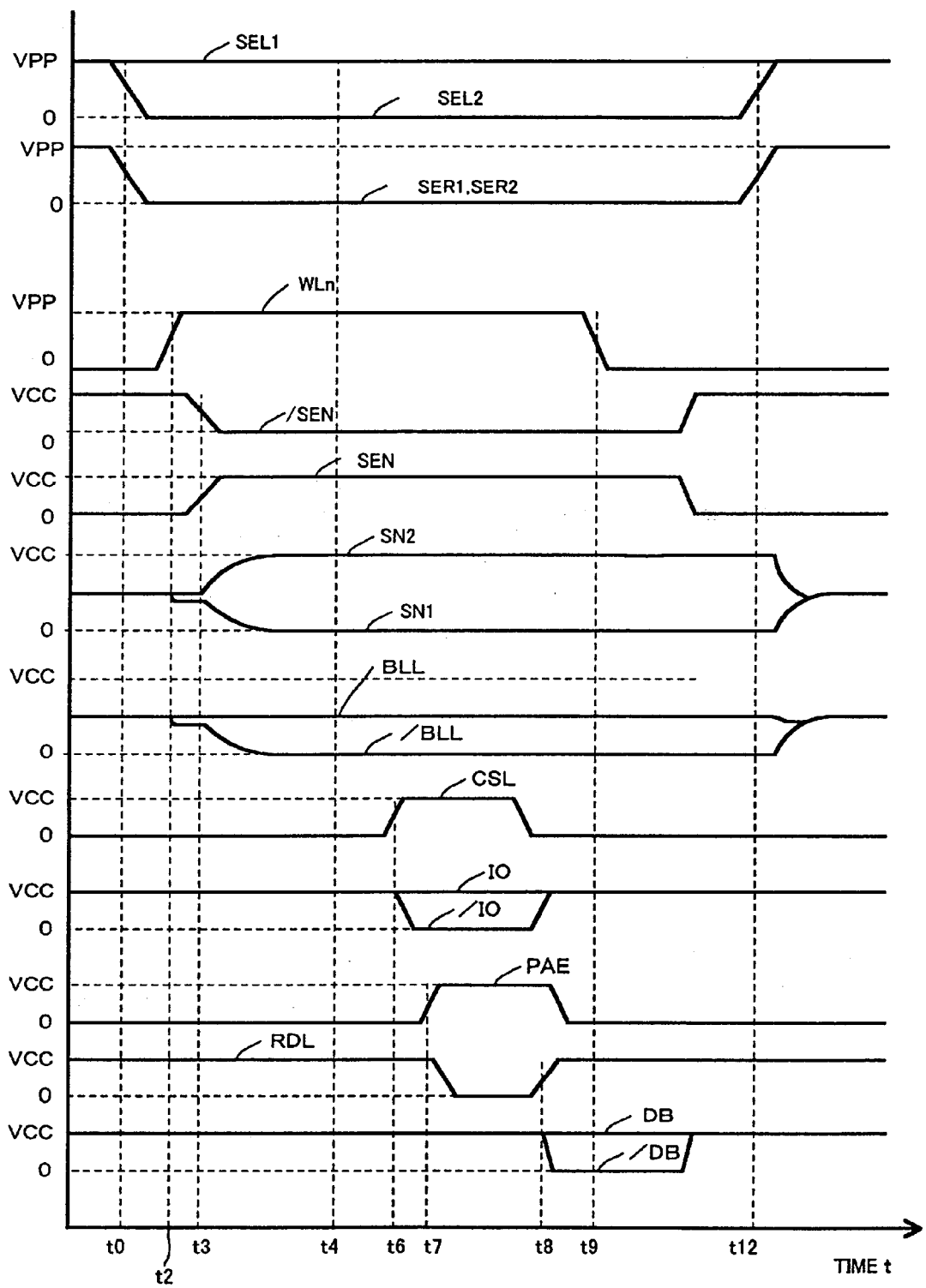
FIG. 12 is a timing chart showing another example of the operation of the semiconductor memory device in the third embodiment of the invention.

FIG. 12 is a timing chart showing another example of the operation of the semiconductor memory device in the third embodiment of the invention.

Referring to FIG. 12, when the pair of bit lines BLR and /BLR and sense nodes SN1 and SN2 are disconnected from each other at time t0, selection signal SEL2 is also set to the L level. As a result, selection gate SG20 is turned off, and bit line BLL on the reference side and sense node SN2 are disconnected from each other.

Simultaneously, transistor QN21 is turned off. As a result, bit line BLL is disconnected from sense node SN2 before sense amplifier 100 operates, and the potential of bit line BLL is fixed at VCC/2. Since the other operation is the same as that of FIG. 8, its description will not be repeated.

Fourth Embodiment

Figure 13:
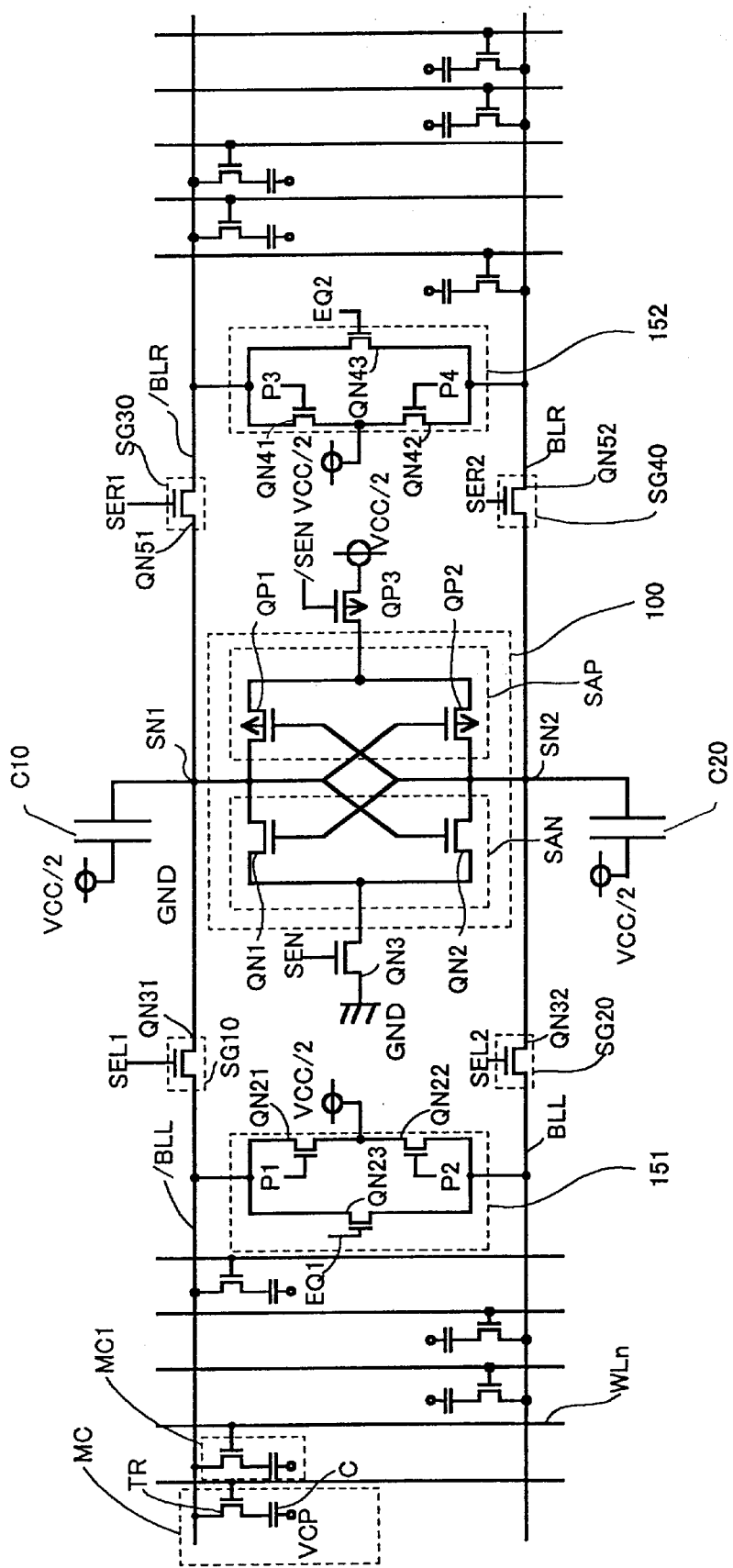
FIG. 13 is a circuit diagram showing the configuration of a sense amplifier and its peripheral circuits in a semiconductor memory device in a fourth embodiment of the invention.

FIG. 13 is a circuit diagram showing the configuration of a sense amplifier and its peripheral circuit in a semiconductor memory device in a fourth embodiment of the invention.

Referring to FIG. 13, different from FIG. 4, capacitor C10 is connected to sense node SN1 and the node of potential VCC/2. Capacitor C20 is connected to sense node SN2 and the node of potential VCC/2. Since the other configuration is the same as that of FIG. 4 in the first embodiment, its description will not be repeated.

With the configuration, by setting a counter electrode of a capacitor for applying a load on the sense node to VCC/2, balance in the sensing operation is achieved.

In the semiconductor memory devices of the second and third embodiments as well, by connecting capacitors C10 and C20 to the potential node of VCC/2 in place of the node of ground potential GND, a similar effect can be obtained.

Fifth Embodiment

Figure 14:
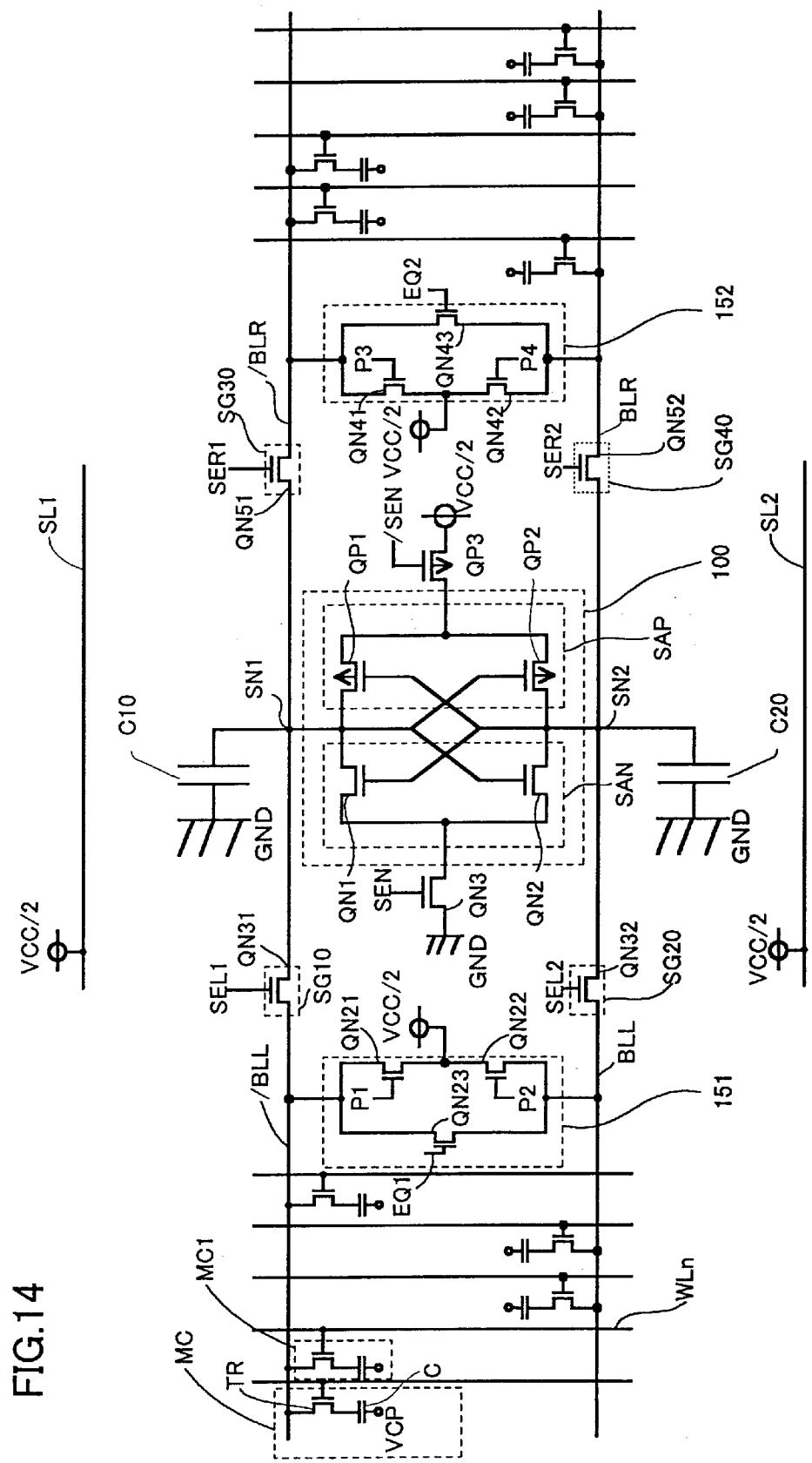
FIG. 14 is a circuit diagram showing the configuration of a sense amplifier and its peripheral circuits in a semiconductor memory device in a fifth embodiment.
Figure 15:
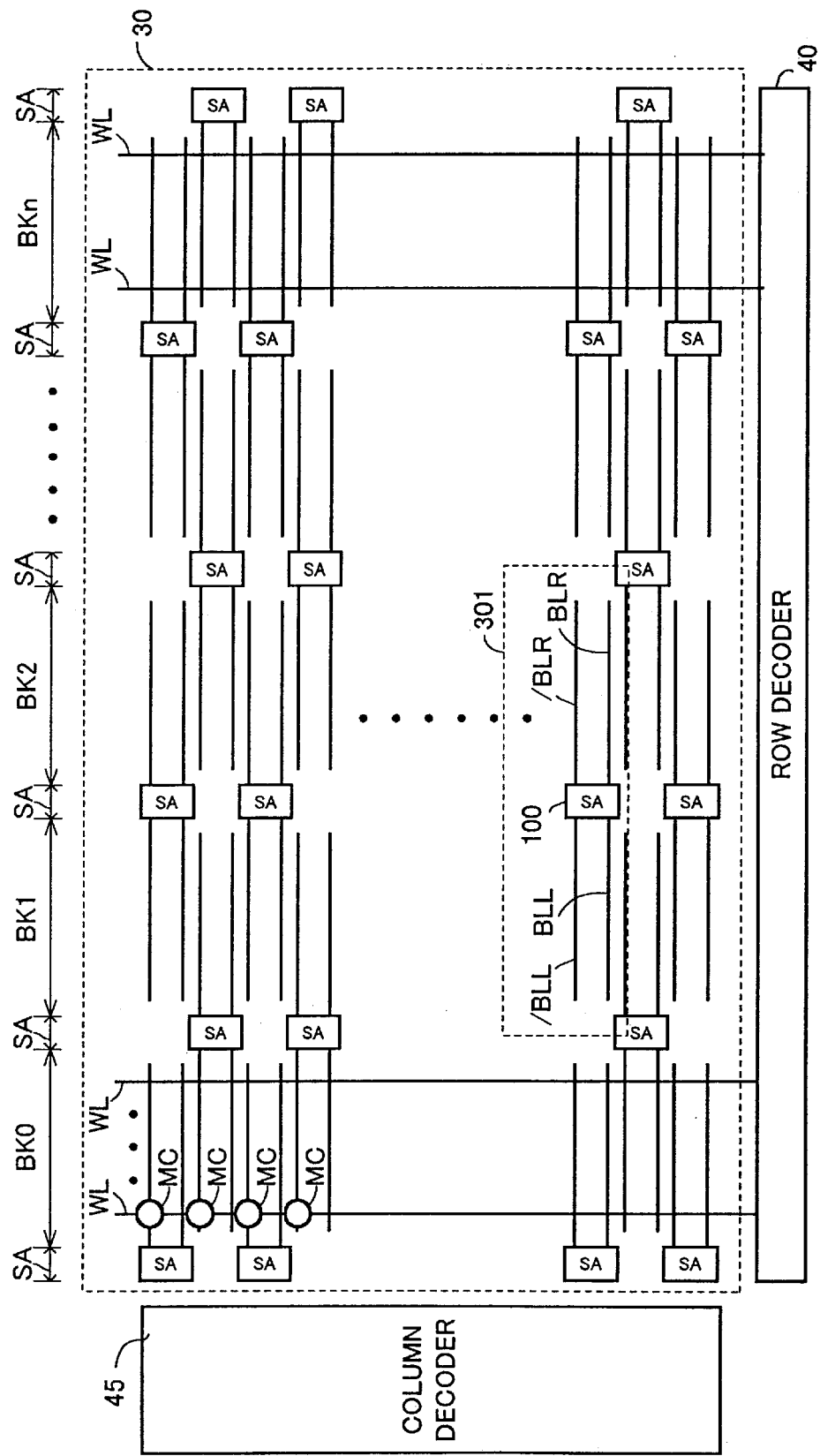
FIG. 15 is a schematic block diagram showing the configuration of a memory cell array and its peripheral circuits in a conventional semiconductor memory device of a folded bit-line architecture.
Figure 16:
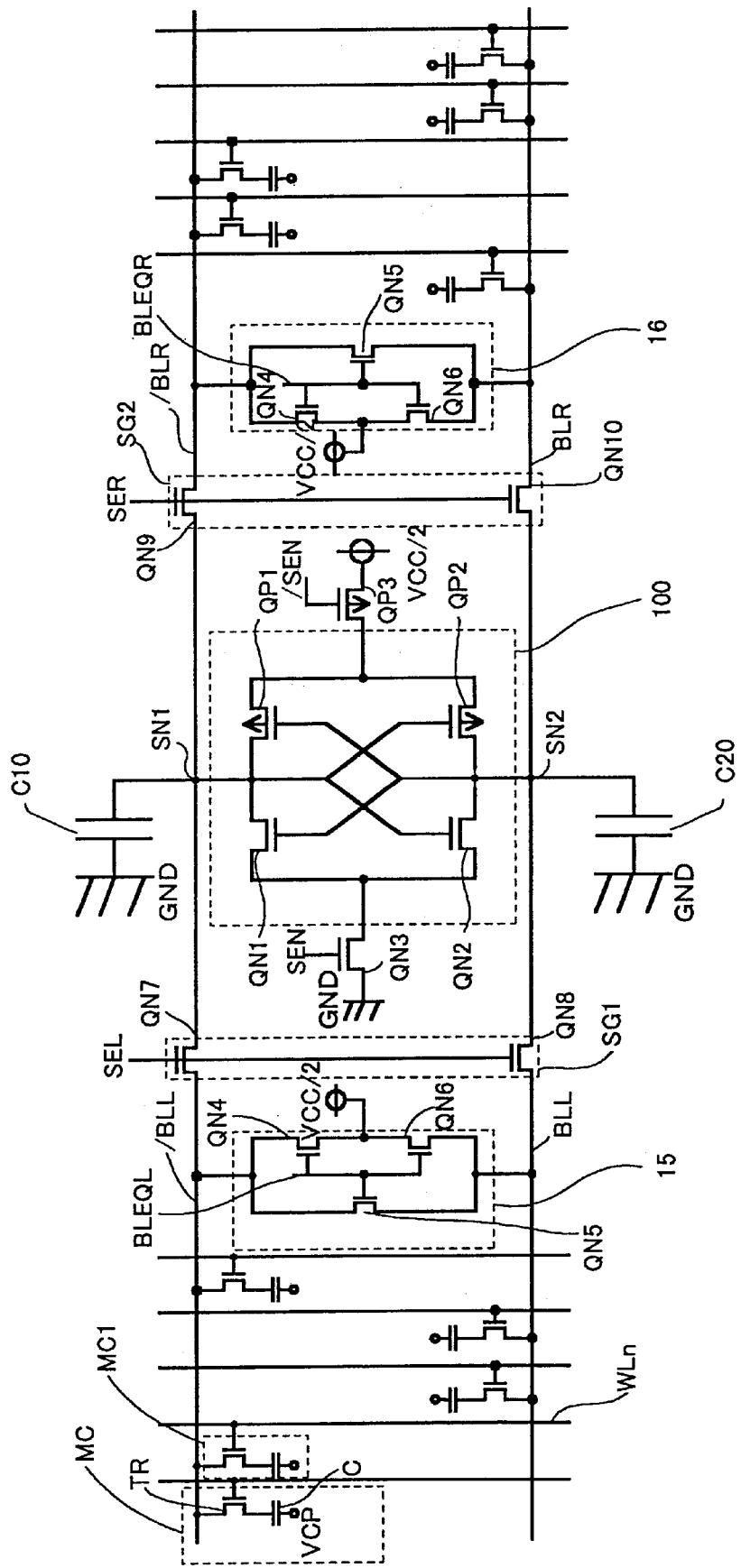
FIG. 16 is a circuit diagram showing the configuration of a region in FIG. 15.
Figure 17:
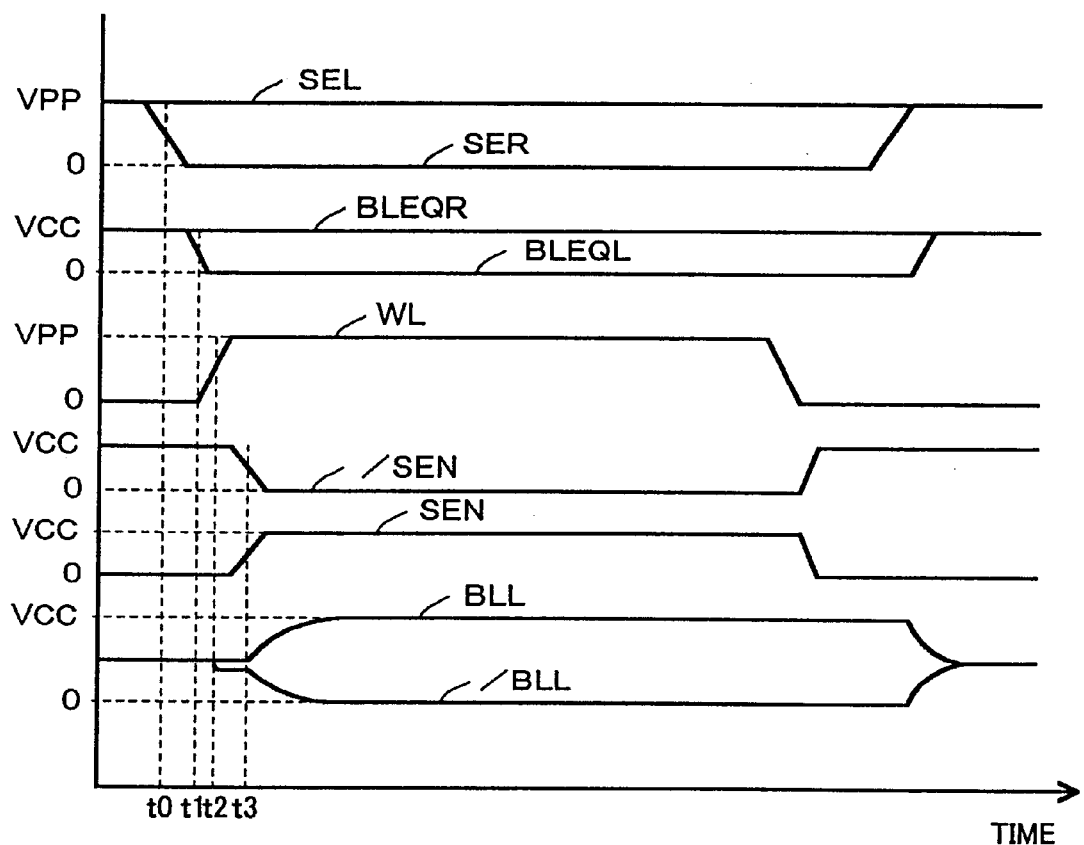
FIG. 17 is a timing chart showing reading operation in a page mode access of the conventional semiconductor memory device.
Figure 18:
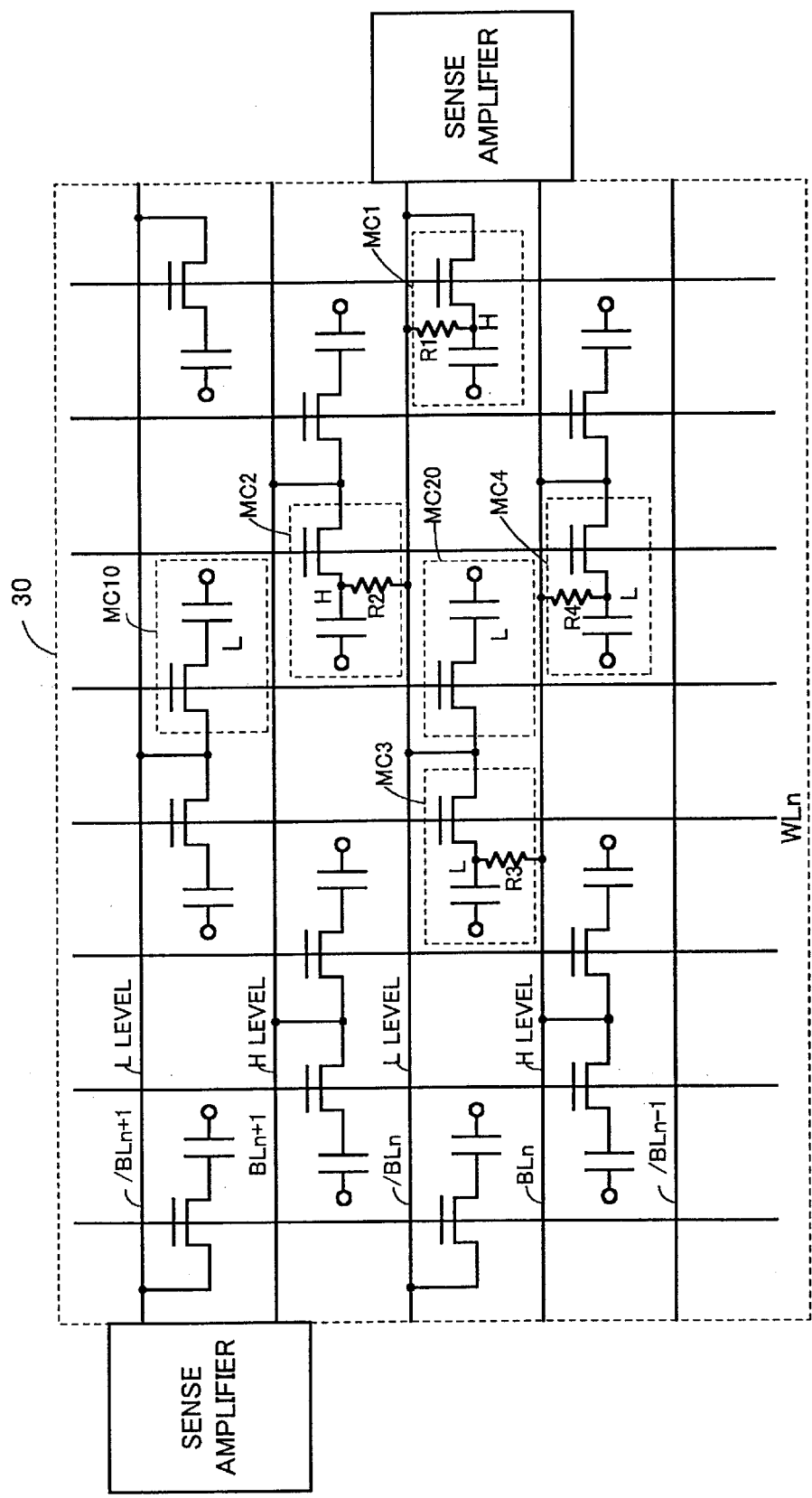
FIG. 18 is a schematic diagram for explaining deterioration in charge storing capability of a memory cell in the conventional semiconductor memory device.
Figure 19A:
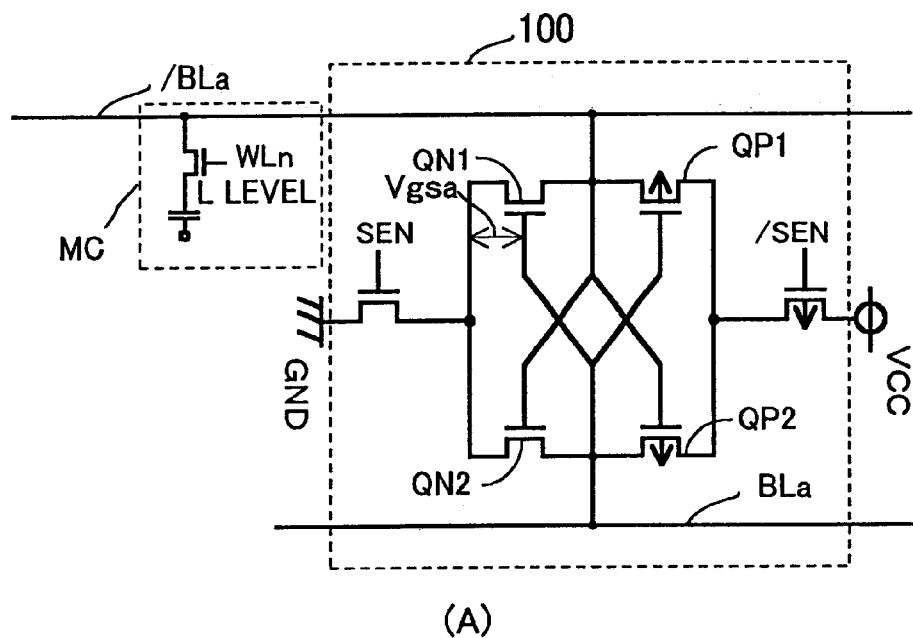
FIG. 19A is a schematic diagram for explaining the operation of a sense amplifier in the case where L-level data is held in a memory cell.
Figure 19B:
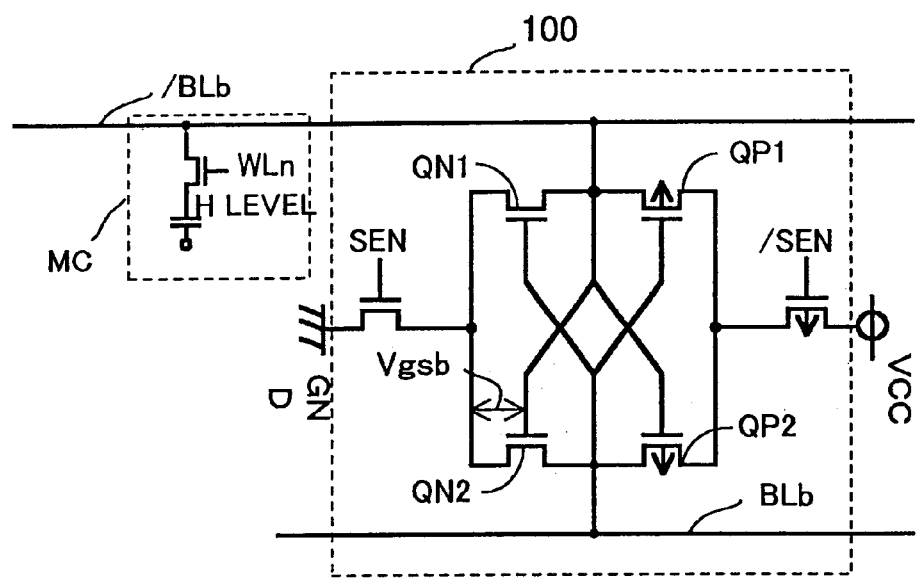
FIG. 19B is a schematic diagram for explaining the operation of a sense amplifier in the case where H-level data is held in a memory cell.
Figure 20:
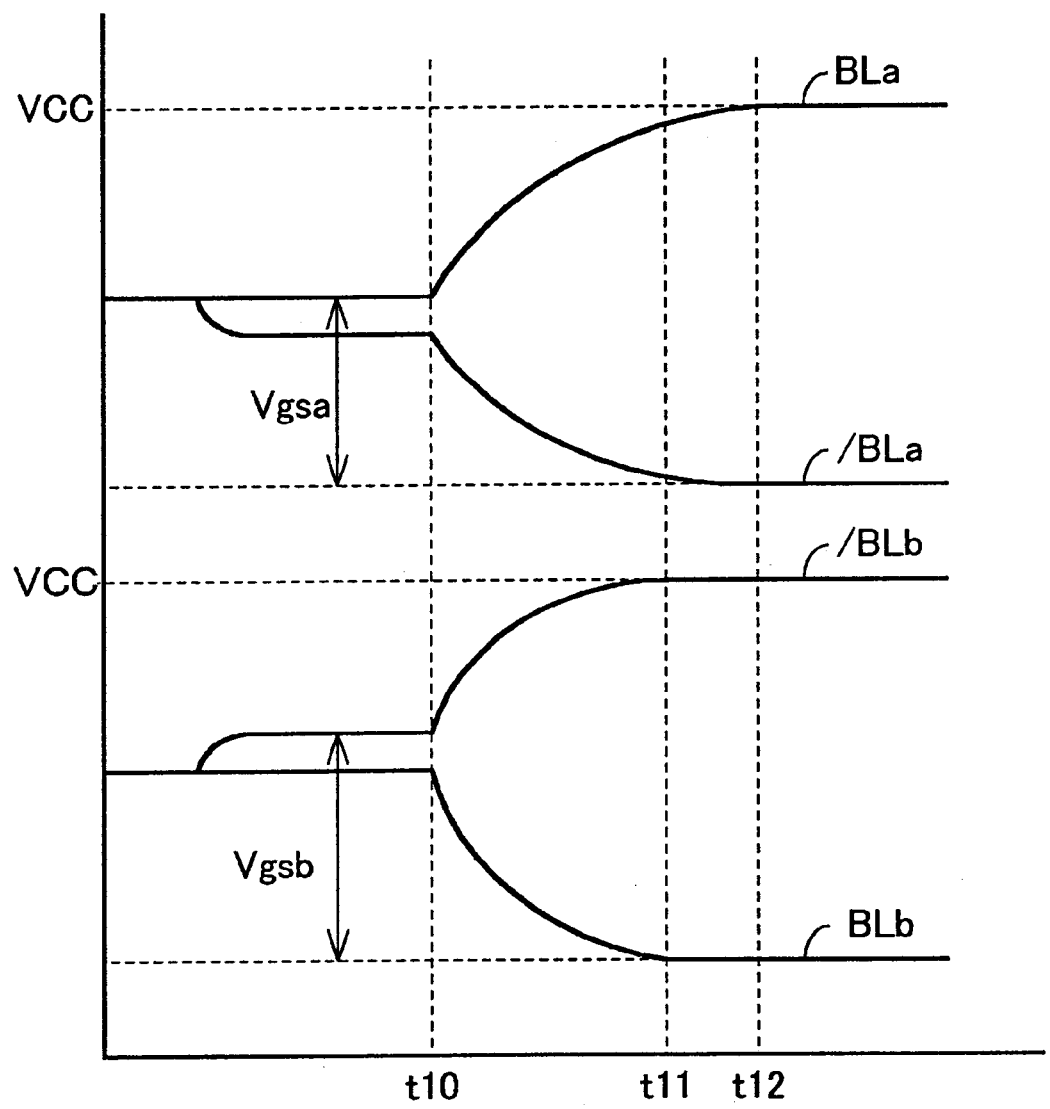
FIG. 20 is a timing chart showing the operation of the sense amplifier in the case of FIGS. 19A and 19B.
Figure 21:
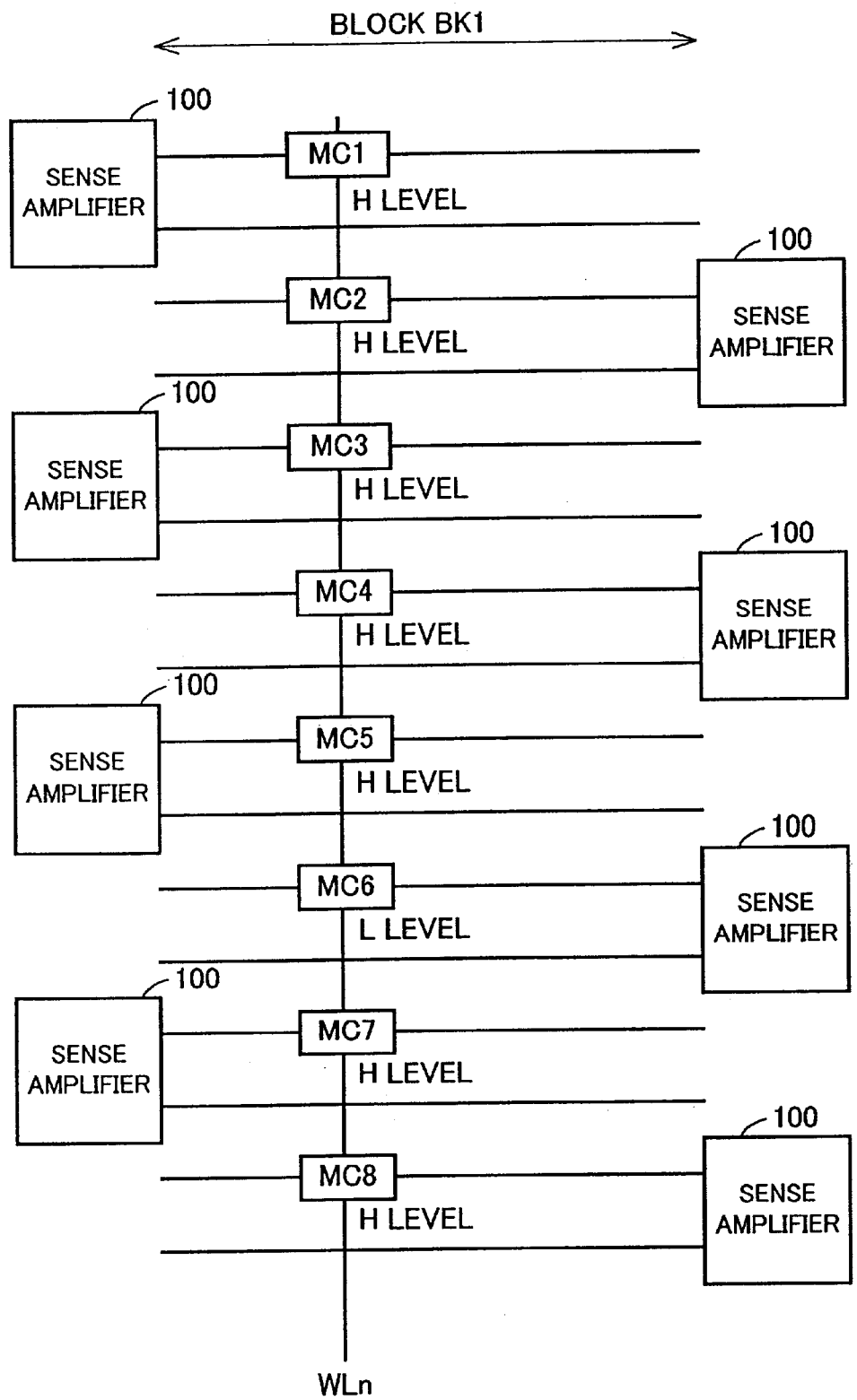
FIG. 21 is a schematic diagram for explaining an influence of ground noise on reading operation.
Figure 22:
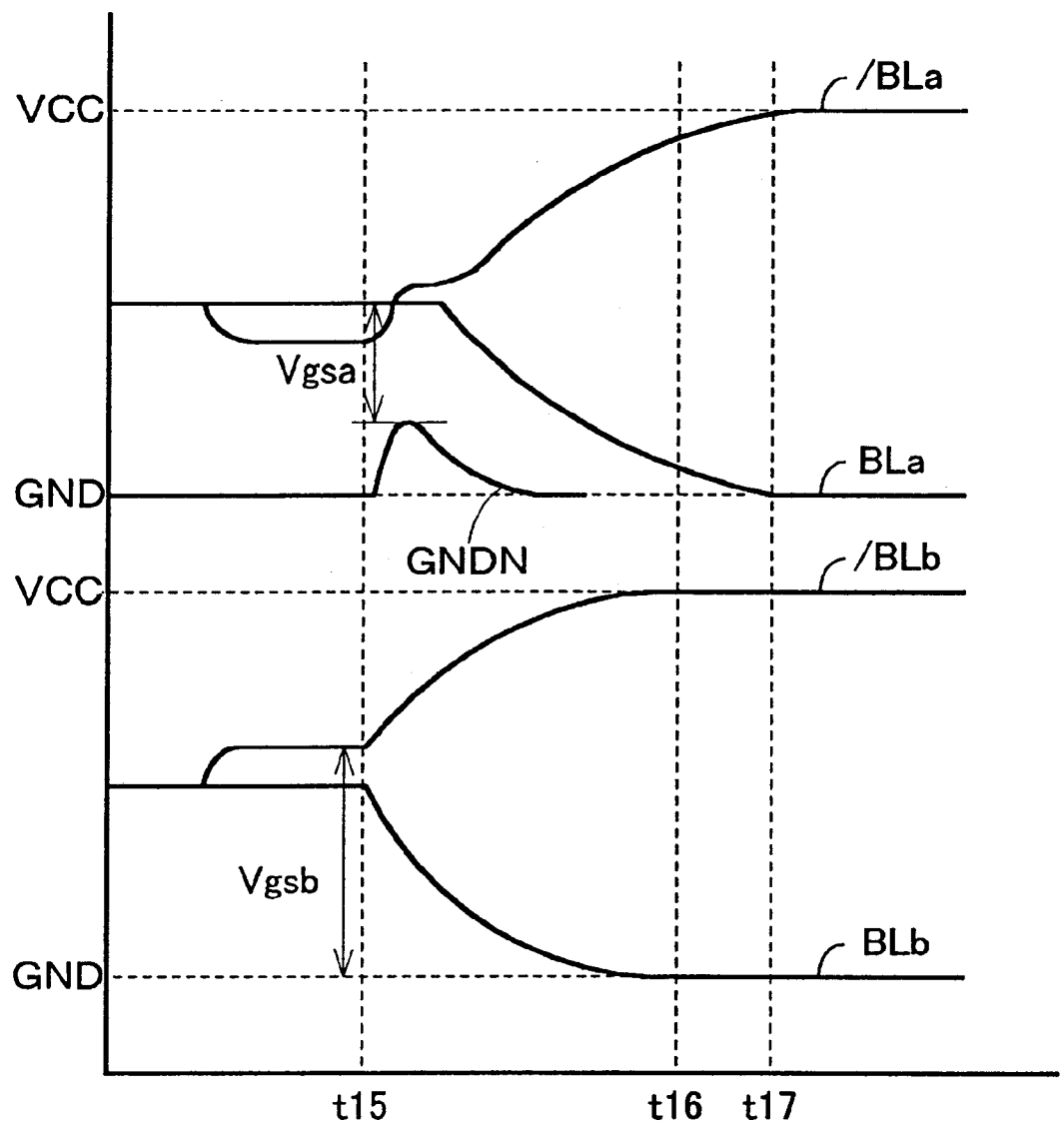
FIG. 22 is a timing chart in the case where data is inverted in operation of reading data in a memory cell shown in FIG. 21.
Figure 23:
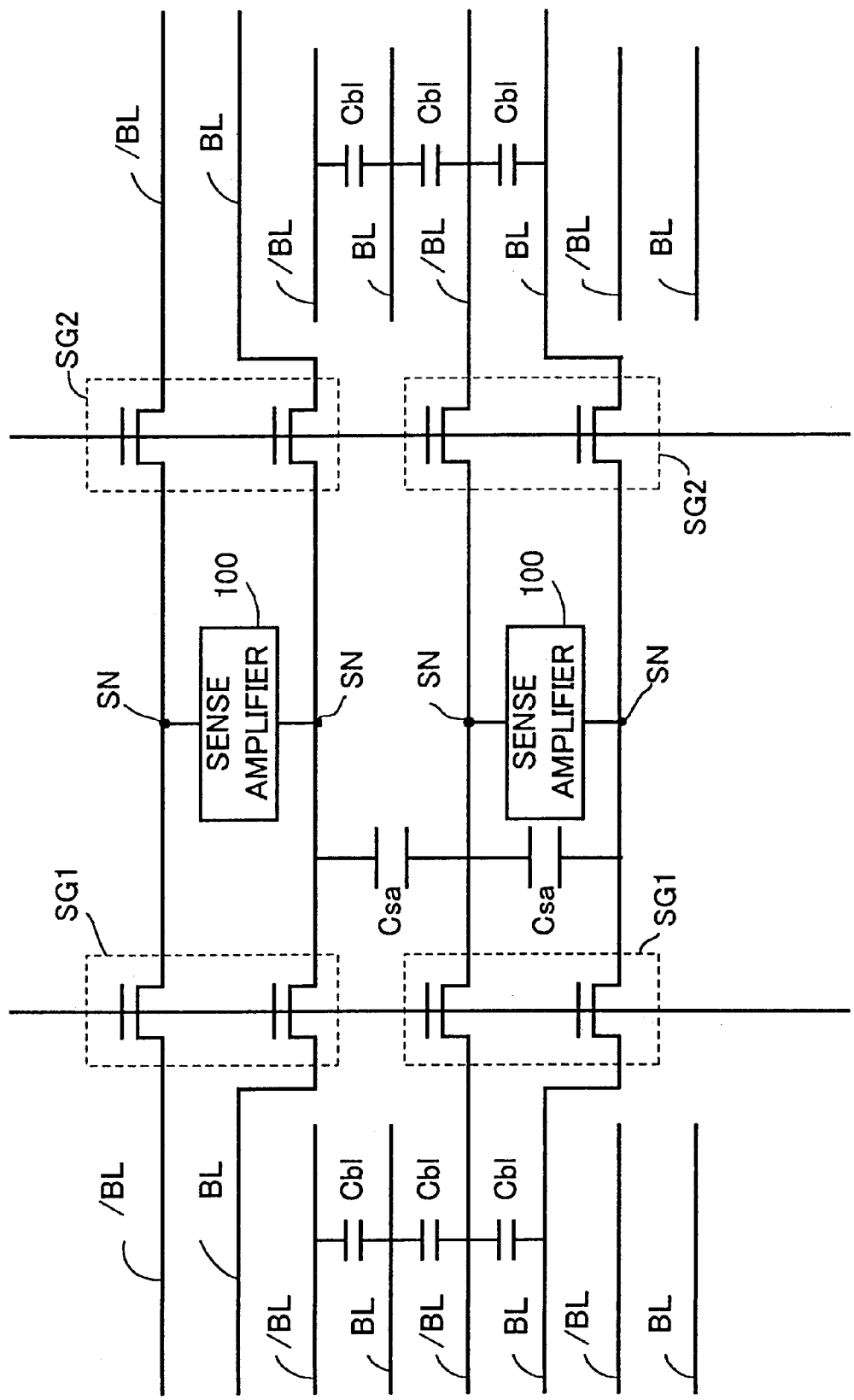
FIG. 23 is a block diagram showing a part of the memory cell array illustrated in FIG. 15.

FIG. 14 is a circuit diagram showing the configuration of a sense amplifier and its peripheral circuits in a semiconductor memory device in a fifth embodiment.

Referring to FIG. 14, different from FIG. 4, shield lines SL1 and SL2 are newly disposed.

Shield lines SL1 and SL2 are arranged in parallel with the pair of bit lines BLL and /BLL so as to sandwich sense amplifier 100 between shield lines SL1 and SL2 and bit lines BLL and /BLL.

Each of shield lines SL1 and SL2 is connected to the potential node of VCC/2. Therefore, the potential of each of shield lines SL1 and SL2 is maintained at VCC/2.

With the configuration, propagation of noise between lines to sense nodes SN1 and SN2 can be prevented.

As a result, more accurate sensing operation can be performed.

Also in the semiconductor memory devices of the second and third embodiments, by disposing shield lines SL1 and SL2 in a manner similar to the fifth embodiment, a similar effect can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    first and second bit lines constructing a folded bit-line pair;
    a memory cell connected to said second bit line;
    an equalizer connected to said first and second bit lines, and precharging said first and second bit lines;
    first and second sense nodes;
    a sense amplifier connected to said first and second sense nodes;
    a first switch circuit connected between said first bit line and said first sense node;
    a second switch circuit connected between said second bit line and said second sense node; and
    a control circuit controlling said equalizer and said first and second switch circuits, wherein
        said equalizer includes:
            a first potential supplying circuit supplying a predetermined potential to said first bit line; and
            a second potential supplying circuit supplying said predetermined potential to said second bit line, wherein
            during a period between time when said equalizer finishes to precharge said first and second bit lines and time when said sense amplifier finishes operation, said control circuit making said first switch circuit off while allowing said second switch circuit to remain on, and controlling said first potential supplying circuit supply said predetermined potential to said first bit line.

2. The semiconductor memory device according to claim 1, wherein said control circuit controls said first switch circuit and said first potential supplying circuit after elapse of predetermined time since said sense amplifier starts operating.

3. The semiconductor memory device according to claim 1, wherein said control circuit controls said first switch circuit and said first potential supplying circuit before said sense amplifier operates.

4. The semiconductor memory device according to claim 1, further comprising a capacitance connected to said first sense node.

5. The semiconductor memory device according to claim 4, further comprising shield lines disposed in parallel with said pair of folded bit lines, connected to said potential node, maintaining a predetermined potential.

6. The semiconductor memory device according to claim 1, wherein said first potential supplying circuit includes a first transistor connected between a potential node and said first bit line, said second potential supplying circuit includes a second transistor connected between said potential node and said second bit line, and said control circuit outputs a first control signal to the gate of said, first transistor, and outputs a second control signal to the gate of said second transistor.

7. The semiconductor memory device according to claim 6, wherein said first switch circuit includes a third transistor having a gate receiving said second control signal, and said second switching circuit includes a fourth transistor having a gate receiving said first control signal.

* * * * *